(12) United States Patent
Liu

(10) Patent No.: US 7,561,438 B1
(45) Date of Patent: Jul. 14, 2009

(54) ELECTRONIC DEVICE INCORPORATING A MULTILAYERED CAPACITOR FORMED ON A PRINTED CIRCUIT BOARD

(75) Inventor: Yungman Liu, Daly City, CA (US)

(73) Assignee: Revera Incorporated, Sunnyvale, CA (US)

( * ) Notice: Subject to any disclaimer, the term of this patent is extended or adjusted under 35 U.S.C. 154(b) by 409 days.

(21) Appl. No.: 11/023,271

(22) Filed: Dec. 22, 2004

(51) Int. Cl.
H05K 1/16 (2006.01)

(52) U.S. Cl. .................. 361/766; 361/760

(58) Field of Classification Search ... 361/306.1–306.3, 361/766, 761–765, 780–785, 760; 257/296–298; 250/372, 336.1, 305, 370.13
See application file for complete search history.

(56) References Cited

U.S. PATENT DOCUMENTS

| | | | |
|---|---|---|---|
| 3,766,381 A | 10/1973 | Watson | |
| 4,048,498 A | 9/1977 | Gerlach et al. | |
| 4,737,639 A | 4/1988 | Rusch | |
| 5,032,724 A | 7/1991 | Gerlach et al. | |
| 5,315,113 A | 5/1994 | Larson et al. | |
| 5,444,242 A * | 8/1995 | Larson et al. | 250/305 |
| 5,635,767 A | 6/1997 | Wenzel et al. | |
| 6,169,652 B1 * | 1/2001 | Klebanoff | 361/234 |
| 6,395,996 B1 | 5/2002 | Tsai et al. | |
| 6,498,714 B1 | 12/2002 | Fujisawa et al. | |
| 6,653,574 B2 | 11/2003 | Tsai et al. | |
| 6,668,447 B2 * | 12/2003 | Samant et al. | 29/830 |
| 7,033,406 B2 * | 4/2006 | Weir et al. | 29/623.5 |
| 2003/0076197 A1 * | 4/2003 | Novak et al. | 333/136 |
| 2004/0231885 A1 * | 11/2004 | Borland et al. | 174/260 |
| 2006/0189068 A1 * | 8/2006 | Larkin et al. | 438/238 |
| 2008/0083881 A1 * | 4/2008 | Gorrell et al. | 250/399 |

OTHER PUBLICATIONS

Peiffer, Joel S., "Fabrication of Embedded Capacitance Printed Circuit Boards," Presented at IPC Printed Circuits Expo® 2001, 5 pages.
Snogren, Richard, "Embedded Passives: The Next Revolution," PC Fab Nov. 2002 pp. 26-29.
Prevallet, M., et al., "High Voltage Considerations with MLCs," Kemet Electronics Corporation, 4 pages.

* cited by examiner

Primary Examiner—Dean A. Reichard
Assistant Examiner—Yuriy Semenenko
(74) Attorney, Agent, or Firm—Blakely Sokoloff Taylor & Zafman LLP

(57) ABSTRACT

An electronic device. The device comprises a printed circuit board, a multilayered capacitor formed on the printed circuit board, and a conductive strip disposed on a top surface of the printed circuit board. The conductive strip interconnects to the multilayered capacitor. The multilayered capacitor includes a plurality of capacitance plates and a plurality of dielectric layers wherein each dielectric layer is disposed between two of the capacitance plates. The printed circuit board further comprises ground plated sidewalls disposed about the printed circuit board. Each of the ground plated sidewalls extends from a top surface to a bottom surface of the printed circuit board.

15 Claims, 14 Drawing Sheets

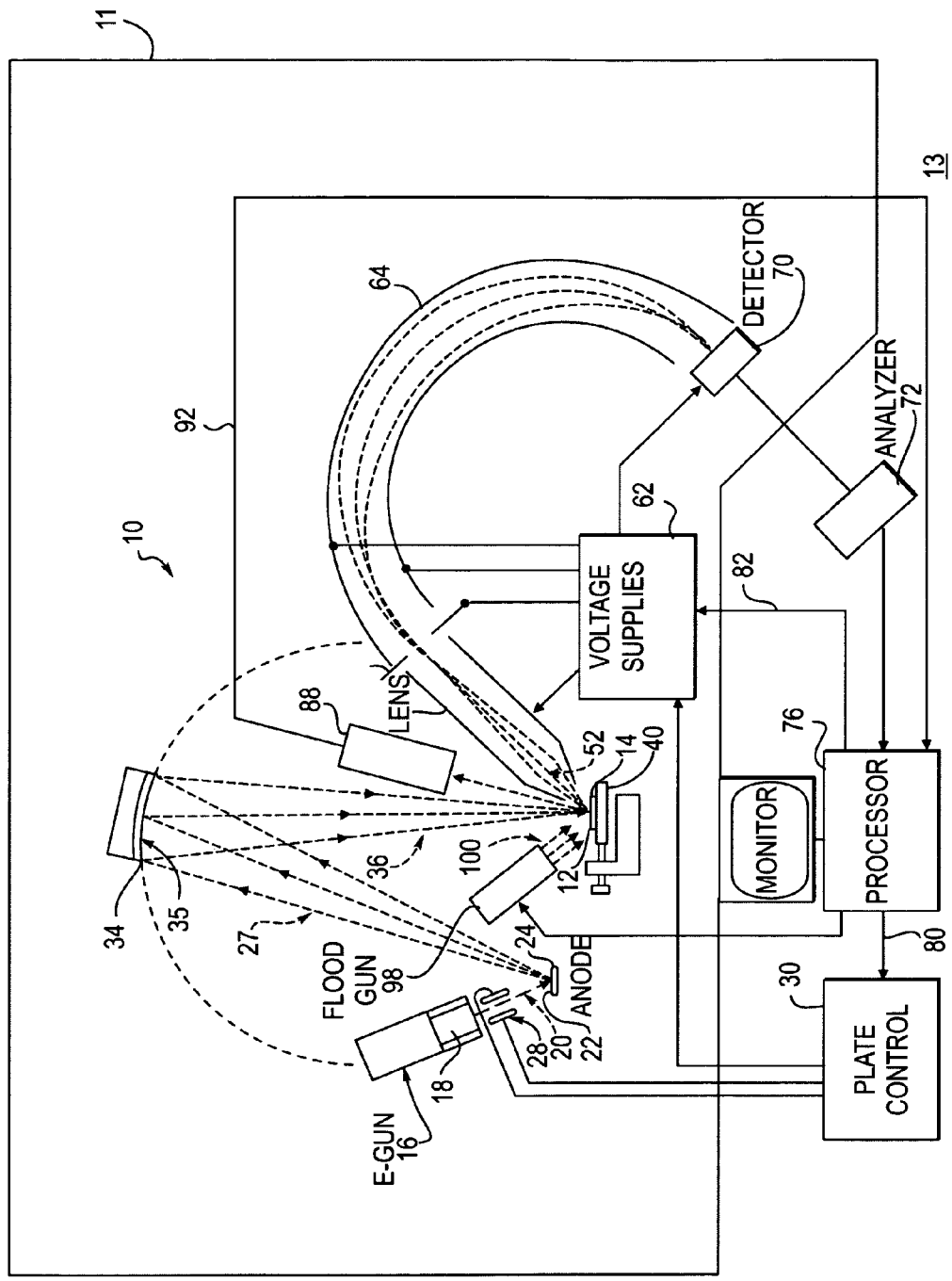

ELECTRONIC DEVICE INCORPORATING A MULTILAYERED CAPACITOR FORMED ON A PRINTED CIRCUIT BOARD

FIELD

Embodiments of the present invention relate to an electronic device incorporating a multilayered capacitor formed on a printed circuit board. Such electronic device includes but is not limited to a detector assembly, a multichannel detector assembly, or an electron spectroscopy.

BACKGROUND

A variety of electron microscopes and associated surface analyzers have evolved in recent years. One approach is electron spectroscopy for chemical analysis (ESCA) which involves irradiating a sample surface with ultraviolet or preferably x-rays and detecting the characteristic photoelectrons emitted. The latter method is also known as x-ray photoelectron spectroscopy (XPS). The photoelectrons are filtered by an electrostatic or magnetic analyzer which allow only electrons of a specified narrow energy band to pass through to a detector. The intensity of the detected beam typically represents the concentration of a given chemical constituent on or near a specimen surface. U.S. Pat. No. 3,766,381 (Watson) describes such a system. Electron kinetic energies are detected and analyzed.

Another method for analyzing surfaces utilizes secondary Auger electrons generated at a small area of sample surface by a focused primary electron beam. Surface mapping of elements is accomplished by scanning with the primary electron beam. An example of a scanning Auger-microprobe utilizing a coaxial cylindrical type of electrostatic electron analyzer is provided in U.S. Pat. No. 4,048,498 (Gerlach et al). Electron kinetic energies are detected and analyzed.

A more commonly known instrument is a scanning electron microscope (SEM) in which a focused electron beam is rastered over a specimen surface. Secondary electrons emitted from the surface are detected in correlation with rastering positions. The secondary electron signals are processed electronically to provide a picture or image of topographical features of the surface.

Often, one or more than one detectors are generally used for the analyzing and imaging functions in a particular instrument. For instance, the detector is configured to receive the electrons that are energized and deflected to the detector and causes signals produced by the energized electrons to be transferred to an analyzer. Many detectors are multichannel detectors that include several channel strips having ceramic tops. Under the current technology, such a detector are typically includes several discrete capacitors which are spring loaded to contact the ceramic top channel strips. The springs connected to the ceramic top channel strips also provide contacts to several pins that allow for the signal to be transmitted from the detector to an analyzer or other devices. Assembling or making such a detector is expensive, time consuming and complicated to say the least. For instance, to assemble a multichannel detector that includes several discrete capacitors, several hours are required for each detector. If there were any loose connection, the detector would need to be disassembled and reassembled.

SUMMARY

Embodiments of the present invention pertain to a multilayered capacitor formed on a printed circuit board and an electronic device such as a detector or a multichannel detector that incorporates a multilayered capacitor. Certain embodiments further pertain to an electronic device (e.g., a detector used in XPS or electron spectroscopy) incorporating a multichannel detector comprising a plurality of high voltage multilayered capacitor formed on and inside a printed circuit board.

Embodiments of the present invention also pertain to an electronic device such as a detector or a multichannel detector with multiple high voltage capacitors integrated into the printed circuit board. By incorporate the capacitors and interconnects into a single PCB, some of the achievements are (1) improve reliability of the device since no complicated assembly is required; (2) reduce expensive maintenance in the field for the device since no complicated assembly is required; (3) improve signal integrity for example, signal paths are well controlled; and (4) save cost in assembling the device, for instance, assembling a complicate detector with discrete capacitors, springs, and contact pins are much more expensive and costly.

An embodiment of the present invention pertains to an electronic device, which comprises a printed circuit board, a multilayered capacitor formed on said printed circuit board, and a conductive strip disposed on a top surface of the printed circuit board. The conductive strip interconnects to the multilayered capacitor. The multilayered capacitor includes a plurality of capacitance plates and a plurality of dielectric layers wherein each dielectric layer is disposed between two of the capacitance plates. The printed circuit board further comprises ground plated sidewalls disposed about the printed circuit board. Each of the ground plated sidewalls extend from a top surface to a bottom surface of the printed circuit board. The printed circuit board can be incorporated into a detector where the conductive strips can be a detector strip and the multilayered capacitor be the signal carrier. In one embodiment, the multilayered capacitor is a high voltage (e.g., about 2000-4000 volts) multilayered capacitor.

An embodiment of the present invention pertains to an electronic device which comprises a printed circuit board having a top surface and a bottom surface, a plurality of conductive strips disposed on the top surface, and a plurality of multilayered capacitors formed on the printed circuit board. In one embodiment, the multilayered capacitor is a high voltage (e.g., about 2000-4000 volts) multilayered capacitor. Each of the multilayered capacitors has a plurality of capacitance plates and a plurality of dielectric layers. Each dielectric layer is disposed between two capacitance plates. Each of the multilayered capacitors is interconnected to one of the conductive strips. The device further comprises ground plated sidewalls disposed about the printed circuit board. Each of the ground plated sidewalls extend from a top surface to a bottom surface of the printed circuit board. Each of the conductive strips is interconnected to one of the multilayered capacitors. The printed circuit board can be incorporated into a multichannel detector where the conductive strips can be multiple detector strips and the multilayered capacitors be the signal carrier.

An embodiment of the present invention pertains to a method of analyzing a specimen surface which comprises supplying a high voltage bias to a detector, attracting any one of a photon, an electron, a charged particle, and a photoelectron from the specimen surface to the detector, and transmitting a signal generated by any one of the photon, electron, charged particle, and photoelectron contacting or hitting detector to a flexible circuit. The flexible circuit is connected to the detector and configured to receive the signal. The method further includes transmitting the signal from the flexible circuit to an analyzer. The detector includes a printed circuit board having a multilayered capacitor formed thereon and a detector strip disposed on a top surface of the printed circuit board wherein the multilayered capacitor is interconnected to the detector strip. The detector strip is biased with the high voltage (e.g., about 2000-4000 volts). The multilayered capacitor allows the high voltage to be delivered to the detector strip. The multilayered capacitor includes a plurality of capacitance plates and a plurality of dielectric layers with each dielectric layer disposed between two capacitance plates. The detector strip attracts the photon, electron, charged particle, or photoelectron. The detector resides in a vacuum environment. The flexible circuit is configured to bring the signal from the vacuum environment to a non-vacuum environment.

An embodiment of the present invention pertains to a method of analyzing a specimen surface which comprises supplying a high voltage bias to a detector, attracting any one of a photon, an electron, a charged particle, and a photoelectron rastered from the specimen surface to the detector, and transmitting signals generated by any one of the photon, electron, charged particle, and photoelectron contacting or hitting the detector to a flexible circuit. The flexible circuit is connected to the detector and configured to receive the signals. The method further comprises transmitting the signals from the flexible circuit to an analyzer. The detector comprises a printed circuit board having a plurality of multilayered capacitors formed thereon and a plurality of detector strips disposed on a top surface of said printed circuit board. The detector strips are biased with the high voltage (e.g., 2000-4000 volts). The multilayered capacitor allows the high voltage to be delivered to the detector strip. The detector resides in a vacuum environment. Each of the multilayered capacitors is interconnected to one of the detector strips. Each of the multilayered capacitors includes a plurality of capacitance plates and a plurality of dielectric layers. Each dielectric layer is disposed between two capacitance plates. The flexible circuit is configured to bring the signals from the vacuum environment to a non-vacuum environment.

An embodiment of the present invention pertains to a instrument for analysis of a specimen surface which comprises an electron gun that produces a focused electron beam, an anode having an anode surface with the anode being disposed so as to receive the focused electron beam and generate x-rays, a director that selectively directs the focused electron beam to the anode surface, a focuser receptive of the x-rays from the anode for focusing a predetermined energy band of the x-rays as an x-ray spot on a selected area of the specimen surface, such that photoelectrons are emitted from the selected area, and a detector. The detector receives the photoelectrons from the selected area and produces signals representative of the photoelectrons. The detector further comprises a printed circuit board, one or more multilayered capacitor each having a plurality of capacitance plates and a plurality of dielectric layers with each dielectric layer being disposed between two capacitance plates, and a conductive strip disposed on the top surface of the printed circuit board. The conductive strip is interconnected to the multilayered capacitor. The multilayered capacitor is formed on the printed circuit board.

Other embodiments are also described.

BRIEF DESCRIPTION OF THE DRAWINGS

The embodiments of the present invention are illustrated by way of example and not by way of limitation in the figures of the accompanying drawings in which like references indicate similar elements. The invention may best be understood by referring to the following description and accompanying drawings that are used to illustrate embodiments of the invention. It should be noted that references to "an" or "one" embodiment of the invention in this disclosure are not necessarily to the same embodiment, and they mean at least one. In the drawings:

FIG. 8 illustrates an exemplary electron spectroscopy that includes an exemplary device of the present invention.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Embodiments of the present invention pertain to an electronic device that includes a multilayered capacitor formed on a printed circuit board. The multilayered capacitor is also referred to as a built-in capacitor (as opposed to discrete capacitor). Embodiments of the present invention also pertain to a detector or a multichannel detector assembly that can be use in an electron spectroscopy. In the several embodiments, the detector assembly incorporates one or more multilayered capacitors formed on a printed circuit board (PCB). The capacitor allows a high voltage to be applied to one or more conductive strips formed on the PCD of the detector component, which then can attract electrons. Signals produced by the electrons are transmitted out from the detector for analysis. The detector assembly incorporates one or more a resistors formed on the printed circuit board and couples to a multilayered flexible circuit that can bring signals from the detector to an outside or external device (e.g., an analyzer, an amplifier, or a processor). In one embodiment, the signals produced by the electrons are transmitted through the multilayered capacitor to the flexible circuit and to an analyzer. Embodiments of the present invention also relate to electron microanalysis and imaging of surfaces using a detector assembly comprising a multilayered capacitor formed on a printed circuit board.

Embodiments of the present invention improve device reliability since no complicated assembly of discrete capacitor is required. Additionally, maintenance of the devices made in accordance to embodiments of the present invention is simple since with no complicated disassembling and reassembling.

Figure 1A:
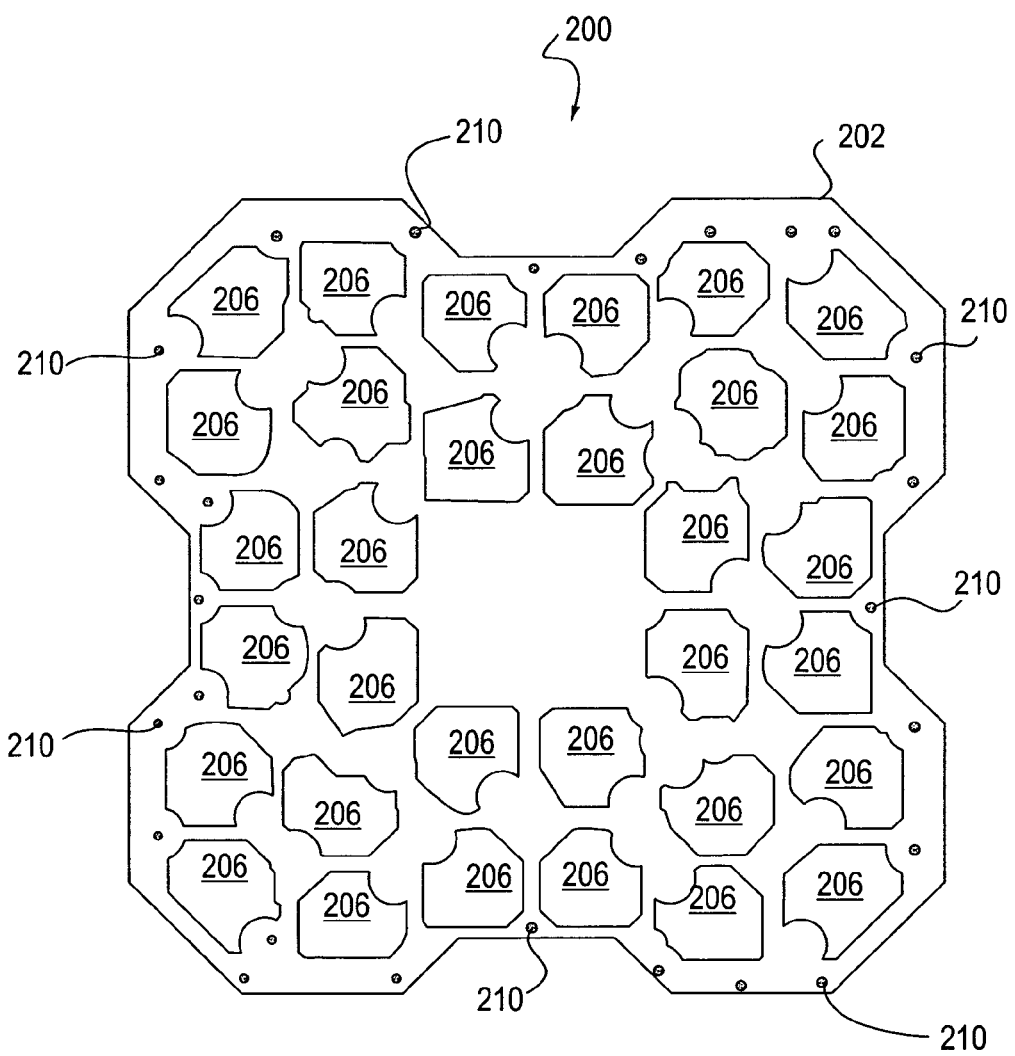
FIGS. 1A-1C, 2, and 3A-3B illustrate different views of an exemplary device that incorporates a multilayered capacitor formed in a printed circuit board.
Figure 1B:
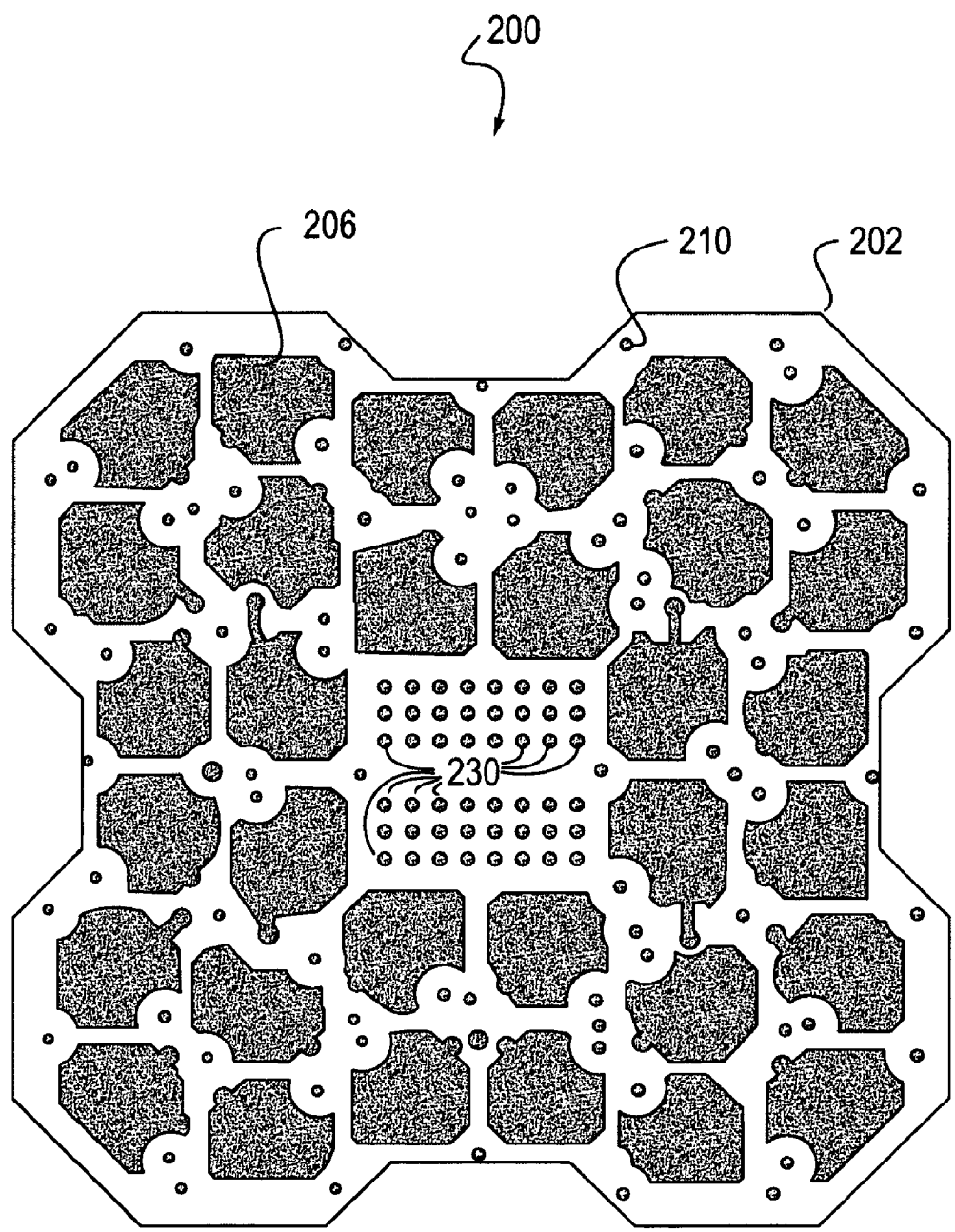
Figure 1C:
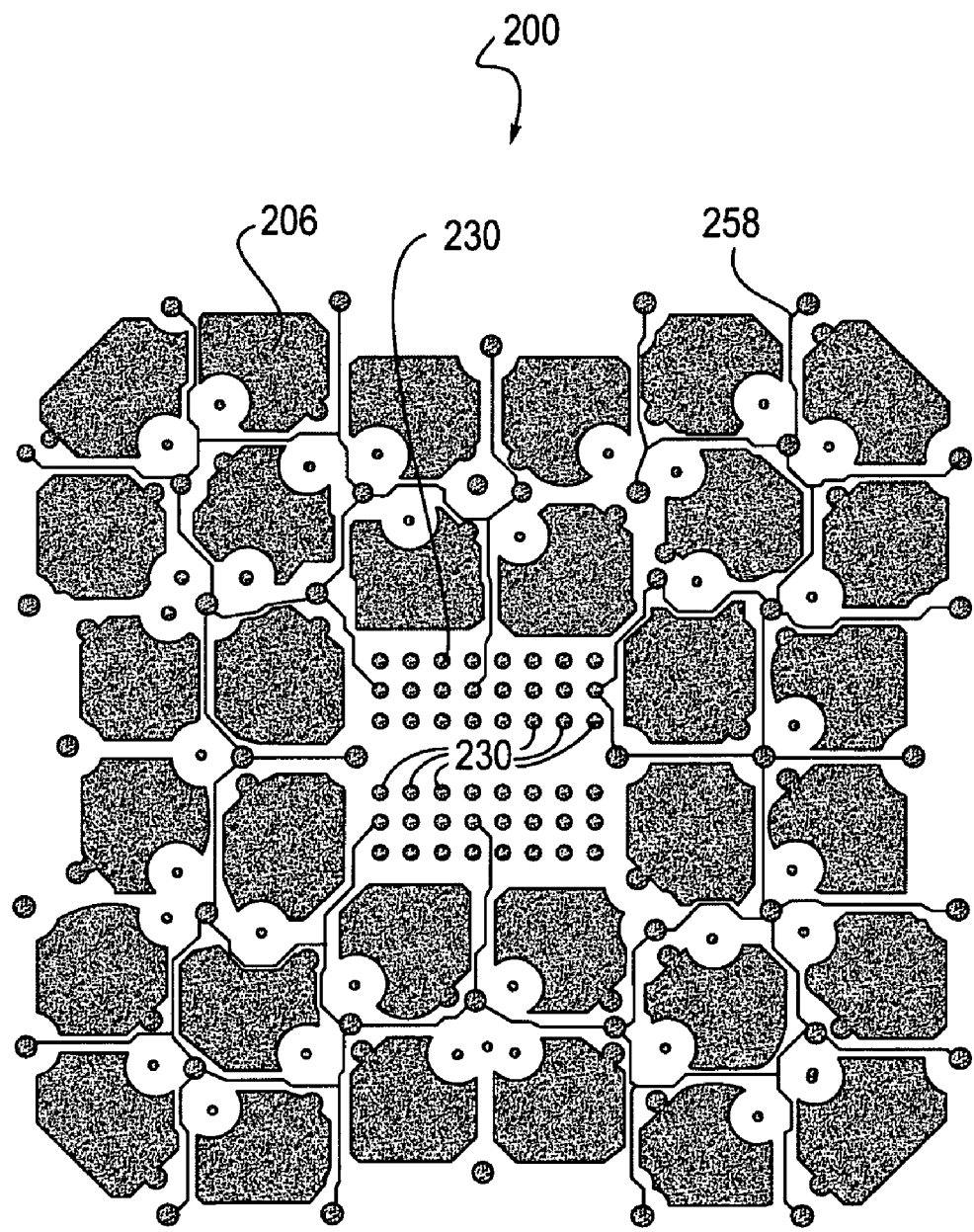
Figure 2:
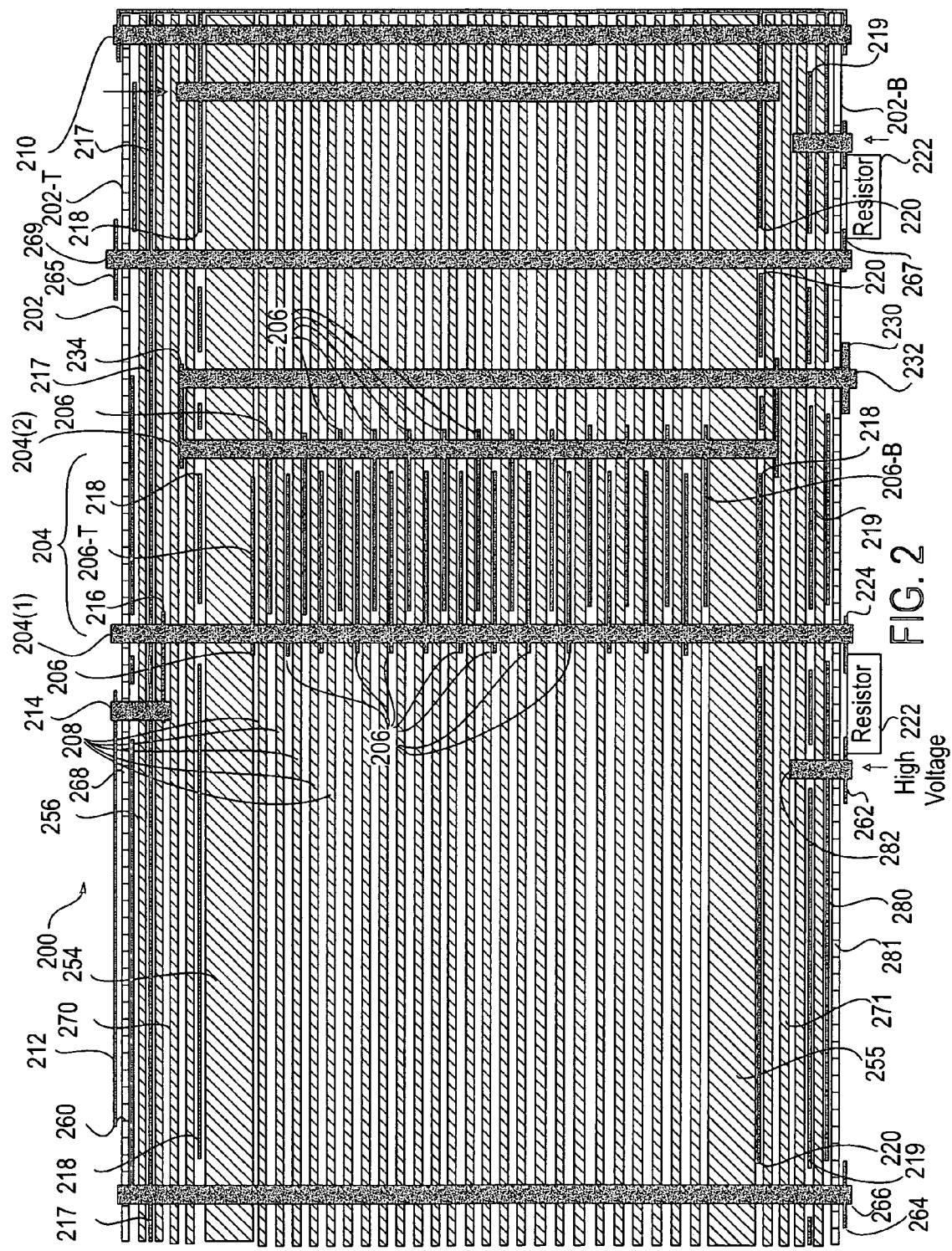

FIGS. 1A-1C and 2-3 illustrate different views or layers of an exemplary electronic device 200 of the present invention. In one embodiment, the electronic device 200 is part of a detector or a multichannel detector. The electronic device 200 comprises a PCB 202, a multilayered capacitor 204 formed on the PCB 202, and a conductive strip 212 disposed on a top surface 202(T) of the PCB 202 (FIGS. 2-3). The conductive strip 212 interconnects to the multilayered capacitor 204 (FIG. 2). The conductive strip 212 may be made of copper, aluminum, gold, silver, gold plated, or other conductive materials. The multilayered capacitor 204 includes a plurality of capacitance plates 206 and a plurality of dielectric layers 208 wherein each dielectric layer 208 is disposed between each two capacitance plates 206. The PCB 202 further comprises ground plated sidewalls 210 disposed about the PCB 202. Each of the ground plated sidewalls 210 extend from the top surface 202(T) to a bottom surface 202(B) of the PCB 202.

The circuit board 202 comprises multiple active layers formed on top of one another. As used herein, an active layer is typically an electrode layer. Each active layer is insulated from another active layer by a dielectric layer. One active layer is electrically interconnected to another active layer by interconnections formed through vias drilled into the layers and/or by interconnections formed by an active layer. The multilayered capacitor 204 is formed on, within, or embedded within the PCB 202 using the multiple active layers, dielectric layers, and interlayer interconnections. Suitable methods of forming a multilayered PCB can be utilized to form the device 200. In one embodiment, the device 200 is formed by forming one active layer on the PCB 202 followed by forming a dielectric layer on the active layer. The same process is repeated for as many layers as necessary. Vias or microvias are then drilled into the layers and conductive materials are then used to fill the vias to interconnect one layer to another layer. The device 200 thus includes one or more capacitors 204 embedded into the PCB 202. The device 200 has many benefits. For instance, the electrical performance or reliability of the device 200 is increased as well as the cost of making the device 200 may be significantly reduced since the capacitors 204 are formed in multiple layers.

Some of the multiple active layers of the circuit board 202 make up the multiple capacitance plates 202 as shown in FIG. 2. FIG. 2 illustrates a cross-sectional view of the device 200, which shows the multilayer characteristics the multilayered capacitor 204 and the multilayered PCB 202. As shown in FIG. 2, each multilayered capacitor 204 includes a plurality of capacitance plates 206 formed on the PCB 202 in a stacked up format. In such format, it can be said that the multilayered capacitor 204 is embedded within the PCB 202. The capacitor 204 includes two electrodes, a capacitor electrode 204(1) and a capacitor electrode 204(2). The capacitor electrodes 204(1) and 204(2) interconnect all of the capacitance plates 206 of the multilayered capacitor 204 together to form the multilayered capacitor 204. Vias or microvias are formed into the layers and filled with conductive materials using methods known in the art to interconnect the capacitance plates of each capacitor side to one another. The plurality of capacitance plates 206 enables the multilayered capacitor 204 to have a high capacitance which can range from 200-400 pF in one embodiment. In another embodiment, the capacitor 204 has a capacitance of about 300-400 pF. In general, as the number of the capacitance plates 206 increases, the total capacitance for the multilayered capacitor 204 increases since capacitance values are additive. In one embodiment, the multilayered capacitor 204 includes 16-36 capacitance plates 206. The number of the capacitance plates may vary depending on the desired capacitance value.

The dielectric layer 208 is formed between each two capacitance plates 206 as illustrate in FIG. 2. In one embodiment, each of the dielectric layers 208 has a thickness less than 10 mils, e.g., a thickness of about 4-6 mils. In other embodiment, each of the dielectric layers 208 has a thickness less than 2 mils or less than 1 mils. The thinner the dielectric layer 208, the higher the capacitance value may be for the capacitor 204. Additionally, each of the dielectric layers 208 may have a high dielectric K constant, for example, in one embodiment, each of the dielectric layer 208 has a dielectric K constant of about 10. When the dielectric layer 208 is sufficiently thin, the dielectric constant may be lowered, if desired. Additionally, for a high capacitance value, the thinner the dielectric layer 208, the higher the capacitance value. Thus, it would be desirable to make the dielectric layers 208 as thin as possible (and still able to withstand a high voltage of about 2000-4000 volts.

The capacitor 204 is interconnected to the conductive strip 212 so that a high voltage bias can be applied to the conductive strip 212 and signals generated by the conductive stirs 212 can be transmitted. In one embodiment, as shown in FIG. 2, the capacitor 204 is interconnected to the conductive strip 212 through an interconnection 214 and an interconnection 216. The interconnection 216 may be a conductive layer or active layer formed on the PCB 202. The interconnection 214 is formed vertically through a via formed through one or more layers of dielectric materials and/or layers of active materials. The via is filled with a conductive material to form the interconnection 214. The via is drilled so that it lands on the interconnection 216 to establish an electrical connection between the interconnection 216 and the interconnection 214. The interconnection 216 contacts the side 204(1) in the same manner as the interconnections 216 and 214 contacting each other (e.g., through a via). The interconnections 214 and 216 thus allow for the multilayered capacitor 204 to interconnect to the conductive strip 212. With the interconnection established between the multilayered capacitor 204 and the conductive strip 212, voltage can be applied to the conductive strip 212 and signals can be transmitted from the conductive strip 212 through the multilayered capacitor 204, in one embodiment, to a lower voltage side or device.

In one embodiment, the conductive strip 212 is a detector strip provided in a detector such that when a high voltage is applied, the conductive strip 212 is biased with the high voltage. Charged particles can then be detected by the detector: the detector strip (or the conductive strip 212) attracts the charged particles and generates signals indicative of such charged particles. In one embodiment, each capacitor 204 is capable of handling a high voltage of about 2000 volts. In other embodiments, each capacitor 204 is capacitor is capable of handling a voltage between about 1000 to about 4000 volts. In one embodiment, the voltage applied to the conductive strip 212 is a positive voltage such that electrons can be attracted to the conductive strip 212. In the present embodiment, the electrons' charges produce signals and the capacitor 204 transmits the signals out form the device 200 to an external device such as an analyzer. In other embodiments, the device 200 is configured such other types of charged particles such as photons or photoelectrons can be attracted to the conductive strip 212. The voltage applied thus can be negatively or positively charged depending on the types of charged particles to be detected by the device 200.

Referring still to FIG. 2, the PCB 202 includes an input pad 262 (also referred to as a high voltage (HV) bias input), which is interconnected to the capacitor 204. In one embodiment, the input pad 262 is interconnected to the multilayered capacitor 204 through an interconnection 282 and an interconnection 280. The interconnections 280 and 282 are formed similarly to the interconnections 214 and 216 previously discussed. A resistor 222 is also formed or soldered onto the PCB 202 and interconnected to the input pad 262 and the capacitor 204 through an interconnection 224. The high voltage bias can be transmitted to the conductive strip 212 through the input pad 262, the interconnections 280 and 282, the resistor 222, the interconnection 224, and the capacitor 204. The resistor 222 helps directing the flow of voltage and signals from the capacitor 204. The resistor 222 also helps isolating one capacitor 204 from another capacitor 204.

In one embodiment, the plurality of capacitance plates 206 are sandwiched between two or more ground plates such as ground plates 218, 220, 217, and 219 (FIG. 2). In one embodiment, the ground plates 218 and 220 encapsulate the multilayered capacitor 204 and its set of capacitance plates 206. In one embodiment, the ground plate 218 is placed above or on top of the top capacitance plate 206(T) which is the top most capacitance plate 208. The ground plate 218 is insulated from the top capacitance plate 206(T) by a dielectric layer 254, which has a low dielectric constant K in one embodiment. The ground plate 220 is placed below or on the bottom of the bottom capacitance layer 206(B) and insulated from the bottom capacitance plate 206(b) by a dielectric layer 255, which has a low dielectric constant K. In one embodiment, the dielectric layers 254 and 255 have a dielectric constant K between about 2-4. In one embodiment, the capacitor 204 is further encapsulated by another set of ground plates 217 and 219. The ground plate 217 separates the capacitance plate 206 from other top active layers on the PCB 202. The ground plate 219 separates the capacitance plates 206 from other bottom active layers on the PCB 202. As illustrated in FIG. 2, the ground plate 217 is placed above or on the top of the of the ground plate 218 and the ground plate 219 is placed below or on the bottom of the ground plate 220. The ground plates 218 and 217 are insulated from one another by one or more dielectric layers 270 and the ground plates 220 and 219 are insulated form one another by one or more dielectric layers 271.

In one embodiment, the ground plates 219 form a capacitor with the high voltage bias (input 262) such that they can filter noises from the high voltage source that is supplied to the capacitor 204. The ground plates 217 prevent cross talk (or cross signal) between the conductor strip 212 and the capacitance plates 206. The ground plates 218, 220, 217, and 219 also function to protect the plurality of capacitance plates 206.

In one embodiment, the ground plates 218, 220, 217, and 219 encapsulate the capacitor 204 and the capacitance plates 206 such that they can filter noises from the high voltage source that is supplied to the capacitor 204. The ground pates 218, 220, 217, and 219 also prevent cross talk (or cross signal) between the conductor strip 212 and the capacitance plates 206. The ground plates 218, 220, 217, and 219 also function to protect the plurality of capacitance plates 206.

In one embodiment, the ground plated 217 constitute a top ground plate and the ground plate 219 constitute a bottom ground plate of the PCB 202. The top ground plate 217 is placed below the conductive strip 212 and a dielectric layer 256 is disposed between the top ground plate 217 and the conductive strip 212 to insulate the two active layers from each other. The top ground plate 217 is placed above the most top capacitance layer 206(T) of the capacitor 204 and above the ground plate 218 that encapsulate the set of capacitance plates 206. In one embodiment, the dielectric layer 256 is a high K dielectric material having a dielectric constant between about 8-12. The bottom ground plate 219 is placed blow the last capacitance plate 206(B) of the multilayered capacitor 204. Additionally, the bottom ground plate 219 is placed below the ground plate 220 that directly encapsulates the set of capacitance plates 206. The bottom ground plate 219 is insulated from other active layers that may be formed on the PCB 202 by a dielectric layer, which in one embodiment, may also be a high K dielectric layer of about 8-12 dielectric constant.

The ground plated sidewalls 210 are provided in one embodiment to stiffen the PCB 202 to enable the PCB 202 to resist compression or distortion that may be caused by compression. In addition, the ground plated sidewalls 210 prevent tilting or change of shape of the PCB 202 or its active layers (e.g., the capacitor 204 and the capacitance plates 206) embedded within or formed on the PCB 202. Distortion or compression of the PCB 202 and its component may occur when the device 200 incorporating the PCB 202 is placed under a vacuum environment. In one embodiment, each of the ground plated sidewalls 210 is created by drilling a via through the multiple layers of the PCB 202 and filling the via with a material (which could be conductive such as copper or aluminum if desired). Each ground plated sidewall 210 extends from the top surface 202T of the PCB 202 to the bottom surface 202B of the PCB 202.

In one embodiment, the PCB 202 includes a voltage plane 260, which is placed below the conductive strip 212 and insulated from the conductive strip 212 by a dielectric layer 268. The voltage plane 260 may function to control the movement of the charged particles, photons, electrons, or photoelectrons that move toward the conductive strip 212. The voltage plane 260, when biased with a particular voltage, creates an electrostatic field below the conductive strip 212 that causes the charged particles to deflect in a particular direction. In one embodiment, the conductive strip 212 is biased to attract electrons (particles with negative charges). The conductive strip 212 is positively biased. In the present embodiment, the voltage plane 260 can be negatively biased so that the voltage plane is negatively charged or more negatively charged than the electrons. In such embodiment, the electrons tend to be deflected away from the edges of the conductive strip 212 or the areas around the conductive strip 212 which are affected by the negative bias voltage produced by the voltage plane 260. The electrons are thus deflected toward the top surface of the conductive strip 212 which is positively biased. With the voltage plane 260, the charged particles such as electrons can be controlled so that they tend to deflect toward the conductive strip 212 instead of other areas around the conductive strip 212 such as a dielectric layer area. In one embodiment, to balance out the multiple layers on the PCB 202, an active layer 280 is provided. The layer 280 may function as a bottom cap layer for the PCB 202. The layer 280 is placed above some active layers that are placed on the bottom of the PCB 202 such as input/output pads or resistors as shown in FIG. 2. A dielectric layer 281 insulates the layer 280 from these active layers that are placed on the bottom of the PCB 202. The layer 280 may also be the bottom most active layer formed on the PCB 202 and is insulated from the board itself by the dielectric layer 281.

In one embodiment of the present invention, the voltage plane 260 also prevents negative charge built-up of an insulating material (e.g., the dielectric layer 268). In more particular, when there are multiple conductive strips 212 that are placed in parallel with a gap between each two conductive strips 212, the voltage plane 260 prevents charge (e.g., negative charges) built-up of the insulating material at the gap between the adjacent conductive strips. In many devices, insulating materials are used with conductive materials that have low the electron counts and as such when charges are built up in the insulating material, it is not presenting a significant effect or problem. When the electron counts get higher, the insulation material between the conductive strips can be charged up to a high enough negative voltage which can deflect incoming electrons in an unpredictable manner. In the present of a voltage plane such as the voltage plane 260, the voltage plane is placed under each of the conductive strips 212. In one embodiment, the voltage plane 260 is charged to about 1700 volts below the potential of the conductive strips 212. In one embodiment, the gap between each two conductive strips is set to be about 6 mils. In the present embodiment, the electrons that hit the gap between each two conductive strips 212 will see a negative potential and will be deflected away from the gap to the conductive strip on either side. In one embodiment, the gap between the two channel strip is set to this particular width so the negative electric field just high enough to gently push the electron to the conductive strip on either side of the gap but not strong enough to deflect away from the conductive strip surface. The voltage plane 260 allows for the movement of the charged particles to be more predictable and controllable.

In one embodiment, the ground plate 217 is position right under the voltage plane 260. The voltage plane 260 and the ground plate 217 also together form a capacitor, which is used to filter noise on the input voltage. In one embodiment, the voltage plane 260 and the top ground plate 217 constitute a capacitor that may function to filter noise into the capacitor 204 and/or the conductive strip 212. Similarly, the active layer 280 and the bottom ground plate 219 may constitute a capacitor that may function to filter noises into the capacitor 204 and/or the conductive strip 212.

In one embodiment, an input layer or an input pad 264 is provided so that voltage can be supplied to the voltage plane 260. The input pad 264 can be interconnected to the voltage plane 260 through an interconnection 266 formed in the similar manner as the interconnection 214 or the ground plated sidewall 210 previously discussed.

In one embodiment, the input layer 264 also functions as a dual micro channel plate that may work to amplify the signals of the charged particles such as electrons that hits that conductive strip 212 (for instance, the layer 264 may amplify the signals by about 1000 times). Additionally, the PCB 202 also includes another active layer 265 that may serve the same purpose as the layer 264. In that aspect, the active layer 265 may serve as another dual micro channel plate. An input pad 267 and an interconnection 269 are also provided on the PCB 202 so that voltage can be supplied to the active layer 265.

The PCB 202 may, of course, include more than one multilayered capacitor 204. For instance, there may be 16, 32, or 36 multilayered capacitors 204 depending on the desired device that the device 200 is incorporated into. In one embodiment, the number of multilayered capacitors 204 correlates to the number of desired channel in a multichannel detector. These multilayered capacitors 204 thus can replace the conventional discrete capacitor used in a multichannel detector or other devices. In one embodiment, the multiple channels in a detector enable the detector to raster or scan a wide area of a particular specimen thus providing more characteristic of the specimen surface.

In one embodiment, the electronic device 200 comprises a PCB 202 having a top surface 202(T) and a bottom surface 202(B), a plurality of conductive strips 212 disposed on the top surface 202(T), and a plurality of multilayered capacitors 204 formed on the PCB 202. Each of the multilayered capacitors 204 has a plurality of capacitance plates 206 and a plurality of dielectric layers 208. Each dielectric layer 208 is disposed between two capacitance plates 206. Each of the multilayered capacitors 204 is interconnected to one of the conductive strips 212. The device 200 further comprises ground plated sidewalls 210 disposed about the PCB 202. Each of the ground plated sidewalls 210 extend from the top surface 202(T) to the bottom surface 202(B) of the PCB 202. Each of the conductive strips 212 is interconnected to one of the multilayered capacitors 204 similar to previously discussed.

The plurality of multilayered capacitors 204 may be arranged in any format over or on the PCB 202. It is desirable that the plurality of multilayered capacitors 204 be distributed over the PCB 202 in a way that balance the PCB 202. The embedded capacitors 204 can be placed anywhere in the PCB 202 stack up and when more than one capacitors 204 are used, they should be distributed so there is balance in the PCB 202. As such, warping in the PCB 202 is minimized or prevented. In one embodiment, as shown in FIG. 1A, the plurality of capacitance plates 206 of the capacitors 204 are arranged in a substantially symmetrical arrangement. As previously discussed, each capacitor 204 includes the plurality of capacitance plates 206 formed in a stacked up format wherein each plate is insulated from another plate by the dielectric layer 208. Essentially, to form the plurality of multilayered capacitors 204, one set of capacitance plates 206 shown in FIG. 1B is placed on another set of similarly arranged capacitance plates 206 shown in FIG. 1C. The stack up format continues for as many layers as necessary to form the plurality of multilayered capacitors 204. In one embodiment, ground isolation features (not shown) are formed to insulate one set of capacitance plates 206 of one capacitor 204 from another set of capacitance plates 206 of another capacitor 204. The ground isolation features may be formed in the similar manner as the ground plated sidewall 210 (FIG. 2). Thus, vias may be drilled through the layers of the PCB 202 and filled with materials (or conductive material) to form such isolation features. In one embodiment, isolation traces 258 (FIG. 1C) are also formed to isolate one set of capacitance plates 206 from another set of capacitance plates 206. The isolation traces 258 may also be the ground isolation features previously discussed. Viewing from a surface, the ground isolation features may have the configuration of the isolation traces 258 shown in FIG. 1C.

Figure 5:
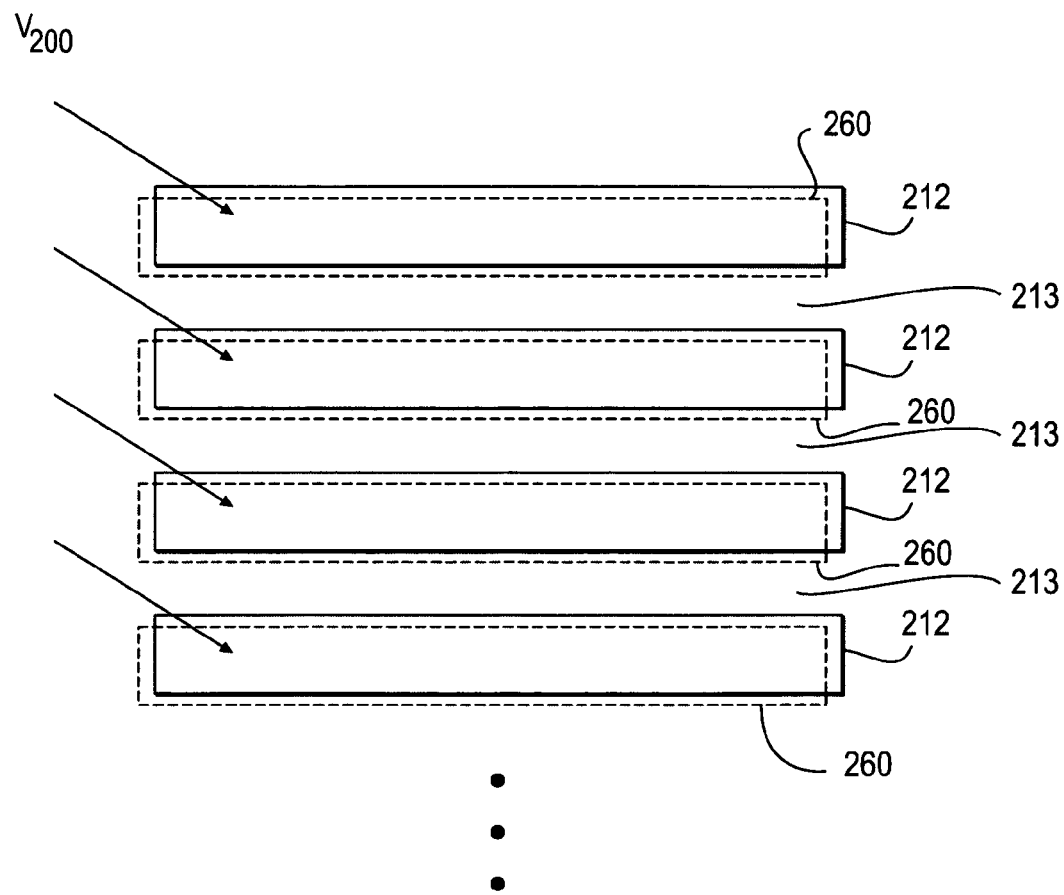
FIG. 5 illustrates an exemplary scheme of how charged particles are attracted to a device that incorporates a plurality of multilayered capacitors formed on a printed circuit board.

In embodiments where the device 200 includes a plurality of multilayered capacitors 204 and a plurality of conductive strips 212, the conductive strips 212 are often placed in close proximity with each other. For instance, in one embodiment, the conductive strips 212 are placed in a parallel pattern as shown in FIGS. 3A-3B and 4-5, and one conductive strip 212 is placed in a very close proximity to another conductive strip 212. In one embodiment, each conductive strip 212 is separated from another conductive strip 212 by a space 213 (FIGS. 3B and 4-5) which may be of a predetermined distance 228. In one embodiment, the distance 228 is about 2-8 mils. In one embodiment, the distance 228 is about less than 15 mils and in another embodiment, less than about 6 mils. In such embodiments, having a voltage plane 260 (as discussed in FIG. 2 above) placed below each conductive strip 212 is particularly helpful in that the voltage planes 260 help deflecting or directing the charged particles (e.g., electrons) toward the surfaces of the conductive strips 212 (FIG. 5). Without the voltage planes 260, the charged particles may hit other areas surrounding the conductive strips 212, such as the space 213 between the conductive strips 212, especially if the charged particles travel at a very high velocity $V_{200}$ as shown in FIG. 5. Having the charged particles landing on other unintended areas may cause undesirable changes to those areas such as causing undesirable characteristic changes to the dielectric layers or other conductive areas around the conductive strips 212. But, with the voltage planes 260, the charge particles traveling at the high velocity $V_{200}$ will tend to be deflected toward the surface of the conductive strips 212 as shown in FIG. 5.

The device 200 further includes an output pad 230 that is interconnected to each multilayered capacitor 204. The output pad 230 transmits an output signal generated from the conductive strip 212 as the charged particles contact the conductive strip 212. In one embodiment, the output pad 230 is positioned at the bottom layer of the PCB 202 (FIG. 2). It is to be noted that the output pad 230 can be placed any where that is convenient on the PCB 202. In one embodiment, the output pad 230 is placed in a center area of the PCB 202 as shown in FIG. 1B. In the present embodiment, the output pad 230 is placed at a location that promotes easy and convenient interconnection to and from the output pad 230 to an external device. In one embodiment, the external device is a flexible circuit that is configured to transmit the signal from the output pad 230 to another device such as an analyzer or an amplifier.

In one embodiment, the output pad 230 interconnects to the conductive strip 212 through a set of interconnects and the capacitor 204. For instance, as shown in FIG. 2, the output pad 230 is interconnected to an interconnect 232 created through the multiple layers of the PCB 202 by a via that is formed and filled with a conductive material as is known in the art. The interconnect 232 connects to another interconnect, an active layer 234, that is further connected to the side 204(2) of the capacitor 204. The capacitor 204 then interconnect the output pad 230 to the conductive strip 212 through another active layer 216 and an interconnect 214 created in the same manner as the interconnect 232. The conductive strip 212 is thus electrically connected externally to outside of the PCB 202 through the interconnect 214, the active layer 216, the capacitor 204, the active layer 234, the interconnect 232, and the output pad 230. The conductive strip 212 can then transmit the signal produced by the charged particles that hit the conductive strip 212 to an external device such as an analyzer or an amplifier through the capacitor 204 and the output pad 230. The device 200 thus can be incorporated into many devices that require transmitting of signals such as a detector.

In embodiments where the device 200 includes a plurality of capacitors 204, a plurality of output pads 230 are provided. Each output pad 230 interconnects to a conductive strip 212 and a multilayered capacitor 204 to an outside device. FIGS. 1B-1C illustrate an exemplary embodiment of a possible arrangement of the output pads 230 on the PCB 202. The plurality of output pads 230 can be arranged in an array of rows and columns or other suitable configuration. In one embodiment, the plurality of output pads 230 are placed on a bottom side of the PCB 202 so that interconnections to the output pads 230 are made to the exposed bottom side of the PCB 202. In other embodiments, the plurality of output pads 230 are placed on an area provided on the PCB 202 such that connection to the output pads can be made by a device.

Figure 6A:
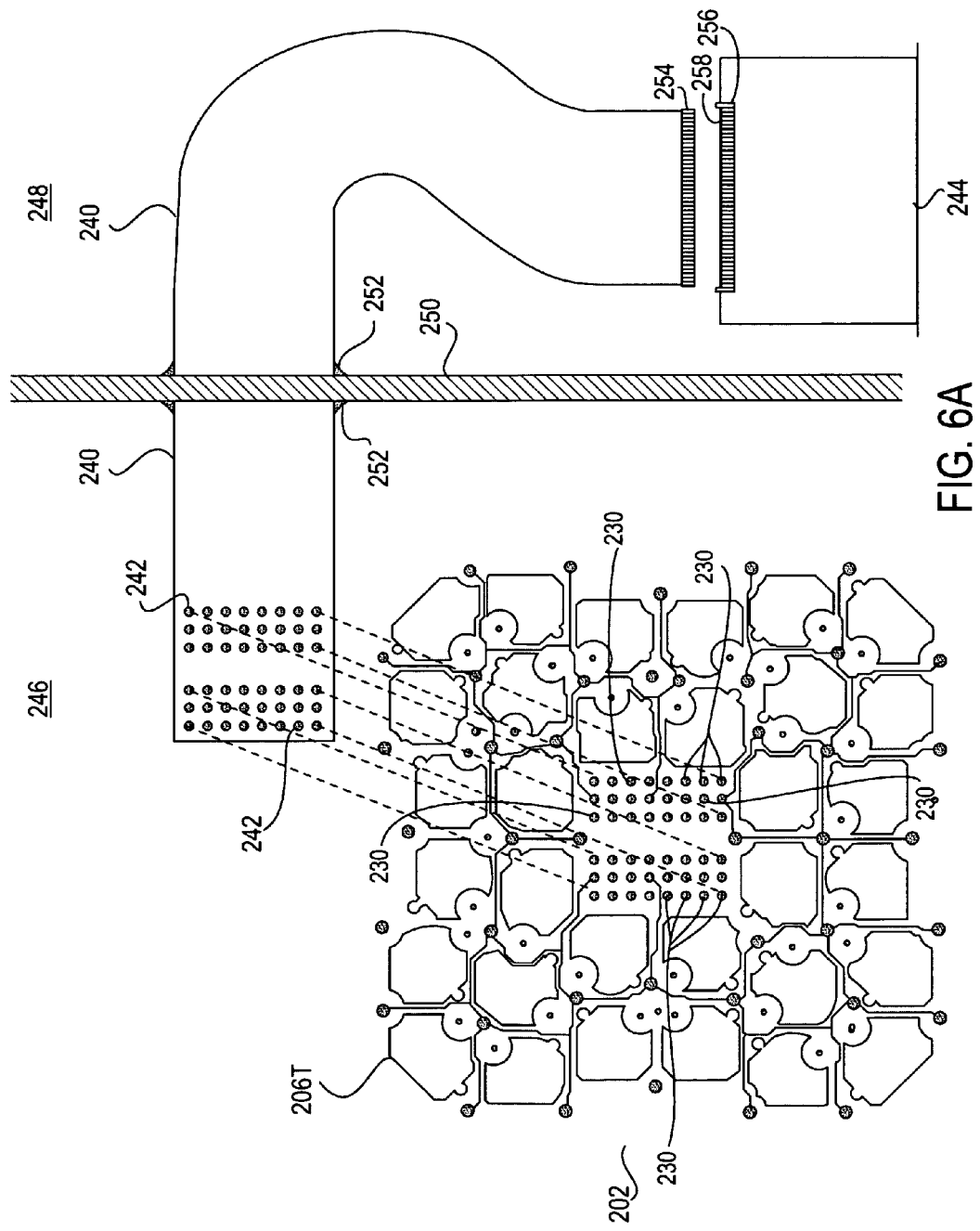
FIGS. 6A-6B illustrate exemplary embodiments of how a device of the present invention is interconnected to an external device.
Figure 6B:
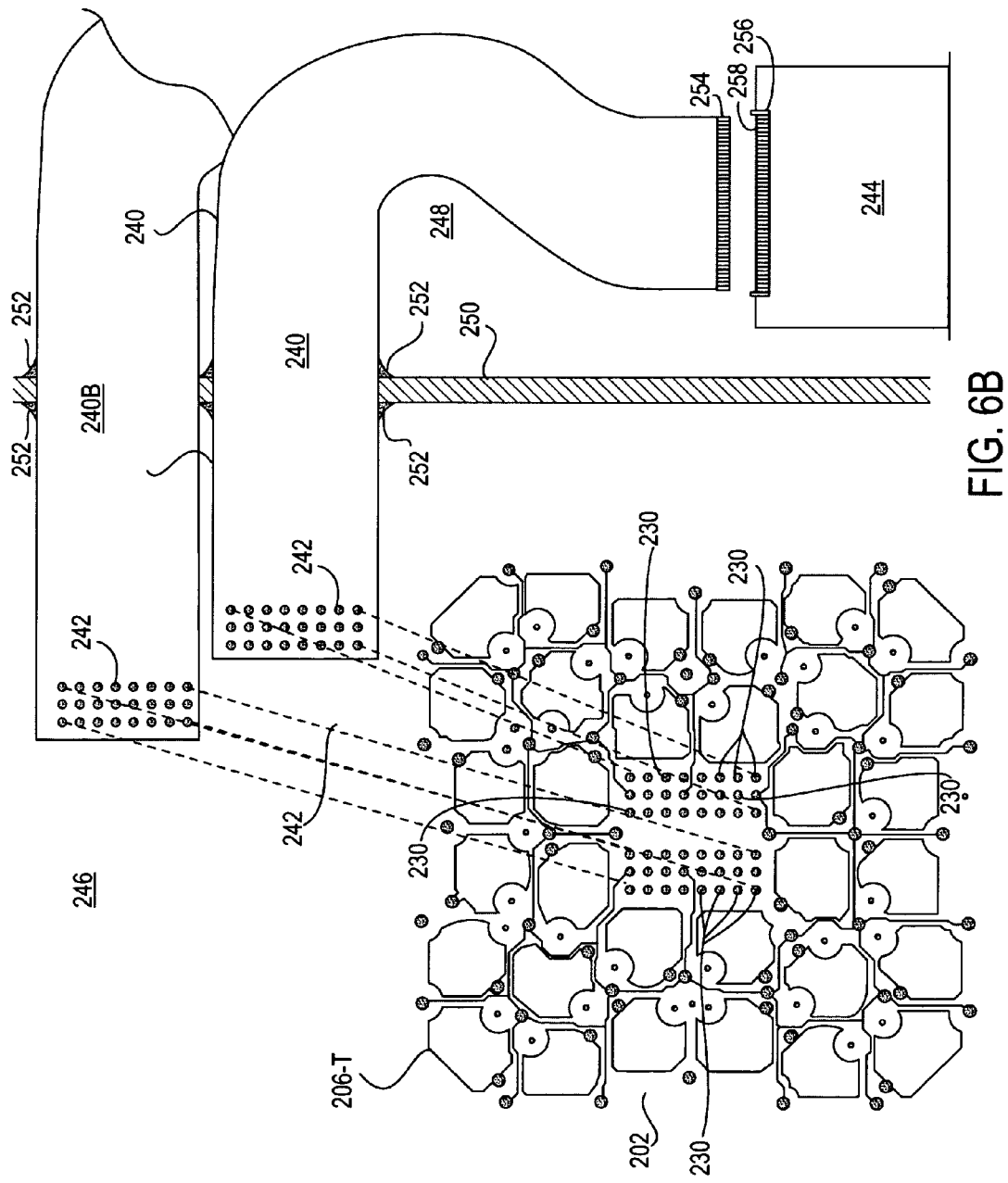

The output pads 230 can interconnect the conductive strips 212 and the capacitors 204 to an outside or external device using various techniques. In one embodiment, the output pads 230 are connected to a set of contact pads on a circuit that is configured to transmit the signal to an external device such as an analyzer, an amplifier, or a signal processor. In one embodiment, a flexible circuit 240 is provided with a plurality of contact pads 242 arranged in a similar pattern at the output pads 230 on the PCB 202 (FIG. 6A). In another embodiment, more than one flexible circuit 240 (e.g., two flexible circuits) are provided, each with a plurality of contact pads 242 that are arranged to connect to a group of output pads 230 on the PCB 202 (FIG. 6B). The contact pads 242 are configured so that each contact pad 240 can easily connect to the output pads 230. The contact pads 242 are connectable to the output pads 230 using various methods. The contact pads 242 and the output pads 230 may have a plug-in or lock-key configuration where either the output pads 230 or the contact pads 242 may be a pin-like configuration and the contact pads 242 or the output pads 230 may have a cap-like configuration that allow the contact pads 242 and the output pads 203 to easily connect to and stay connected to each other. Alternatively, the output pads 230 and the contact pads 242 may be connected to one another using a conductive adhesive or a Z-direction conductive adhesive (not shown).

As shown in FIG. 6A, in one embodiment, the contact pads 242 on the flexible circuit 240 are arranged in the same pattern as the output pads 230 on the PCB 202 (e.g., rows and columns). In this embodiment, one flexible circuit 240 is provided. To interconnect the output pads 230 to the contact pads 242, the flexible circuit 240 is placed over the area of the PCB 202 that has the output pads 230 so that the pattern of contact pads 242 aligns with the output pads 230 and the interconnection is created when the output pads 230 contact, couple to, or connect to the contact pads 242. In one embodiment, the plurality of output pads 230 is arrange in a particular pattern and are placed on the bottom side of the PCB 202. Thus, to interconnect the output pads 230 to the contact pads 242, the flexible circuit 240 is adhered to the bottom side of the PCB 202. There may very well be an area (not shown) near the edge of the PCB 202 that the plurality of output pads 230 may be located and the flexible circuit 240 can be brought into contact with this area in order for the output pads 230 to interconnect to the contact pads 242.

In one embodiment, the flexible circuit 240 transmits the signals produced at the conductive strips 212 to an analyzer 244 (FIG. 6A). The signals may be produced by the charged particles, electrons, photons, or photoelectrons as they hit or come into contact with the conductive strips 212. The device 200 may be incorporated into an instrument that can excite the charged particles, electrons, photons, or photoelectrons from a specimen where the device 200 can function as a detector that can allow for the energy (in the form of a signal or signals) generated by such charged particles, electrons, photons, or photoelectrons to be detected and analyzed. With the multiple conductive strips 212, the device 200 can be incorporated into a multichannel detector and a larger area of the specimen can be detected and analyzed. In one embodiment, the analyzer 244 also includes an amplifier in order to amplify the signals prior to analyzing the signals.

In another embodiment, a second flexible circuit 240B is provided (FIG. 6B). The flexible circuit 240B is similar to the flexible circuit 240 previously described. In the present embodiment, some of the output pads 230 are connected to the contact pads 242 on the flexible circuit 240 and some of the output pads 230 are connected to the flexible circuit 240B. The flexible circuit 240B may also connect to the analyzer 244 in the same manner as the flexible circuit 240 is connected to the analyzer 244.

In one embodiment, the flexible circuit 240 and/or the flexible circuit 240B includes a contact pad similar to a contact pad 242 that can deliver a negative voltage to the PCB 202, for example, to bias the voltage of the voltage plane 260 previously mentioned. In one embodiment, the flexible circuit 240 and/or the flexible circuit 240B includes a contact pad similar to a contact pad 242 that can deliver a voltage to the PCB 202, for example, to apply voltage to the conductive strips 212 previously mentioned.

FIG. 3 illustrates a top surface of the device 200 that can be incorporated into a detector. In one embodiment, the device 200 is a multichannel detector that can be used in an electron spectroscopy instrument. As illustrated here, the device includes the PCB 202 that has a plurality of multilayered capacitors 204 formed therein or thereon as previously discussed. In the present embodiment, the device 200 includes a set of conductive strips 212 which are can be detector strips or channels of the detector. The conductive strips 212 are formed on the top surface of the PCB 202 as previously discussed. In addition, a couple of guard strips 226 are provided on each side of the set of the conductive strips 212. The guard strips 226 prevent damages to the outer edge conductive strips 212. Each conductive strip 212 is interconnected to a multilayered capacitor 204 through the layers of the PCB 202. The interconnections are not visible in this figure. The capacitors 204 can be placed on the PCB 202 in any convenient manner as previously discussed so long as the interconnections can be made to the conductive strips 212. When the top surface of the device 200 is incorporated into the detector, the top surface would be placed over multiple layers of the capacitance plates 206 as shown in FIGS. 1B-1C.

Figure 3A:
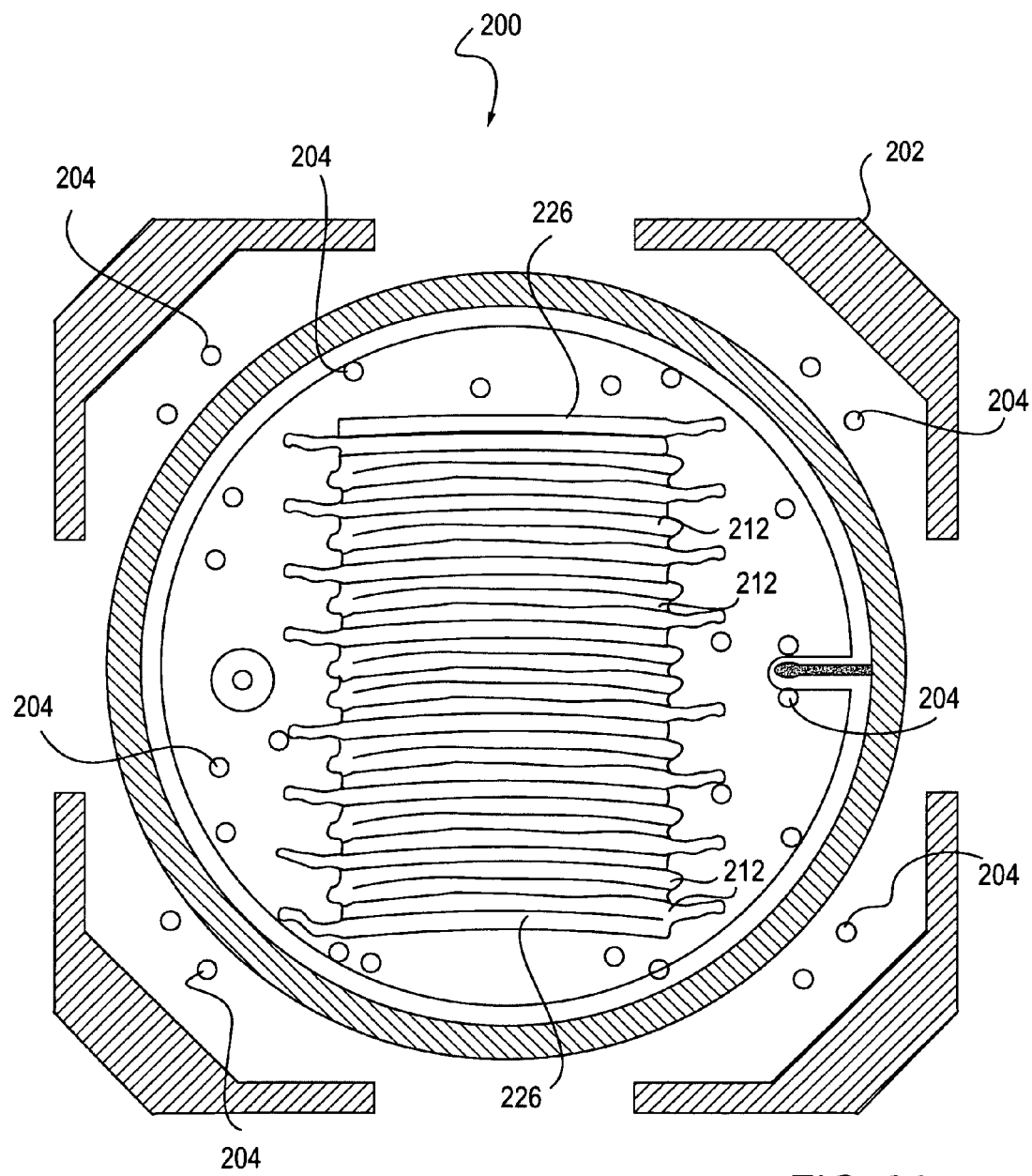
Figure 3B:
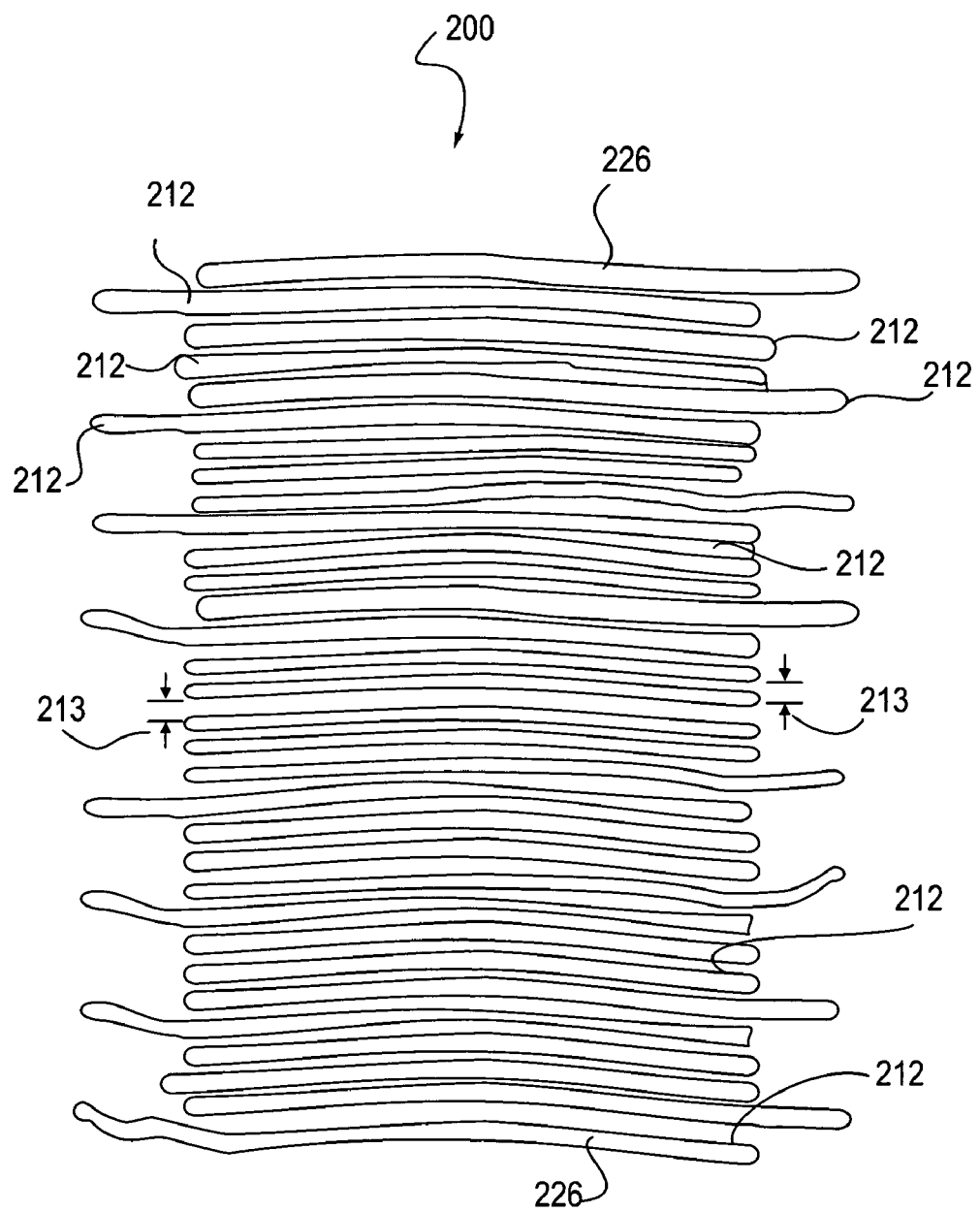
Figure 4:
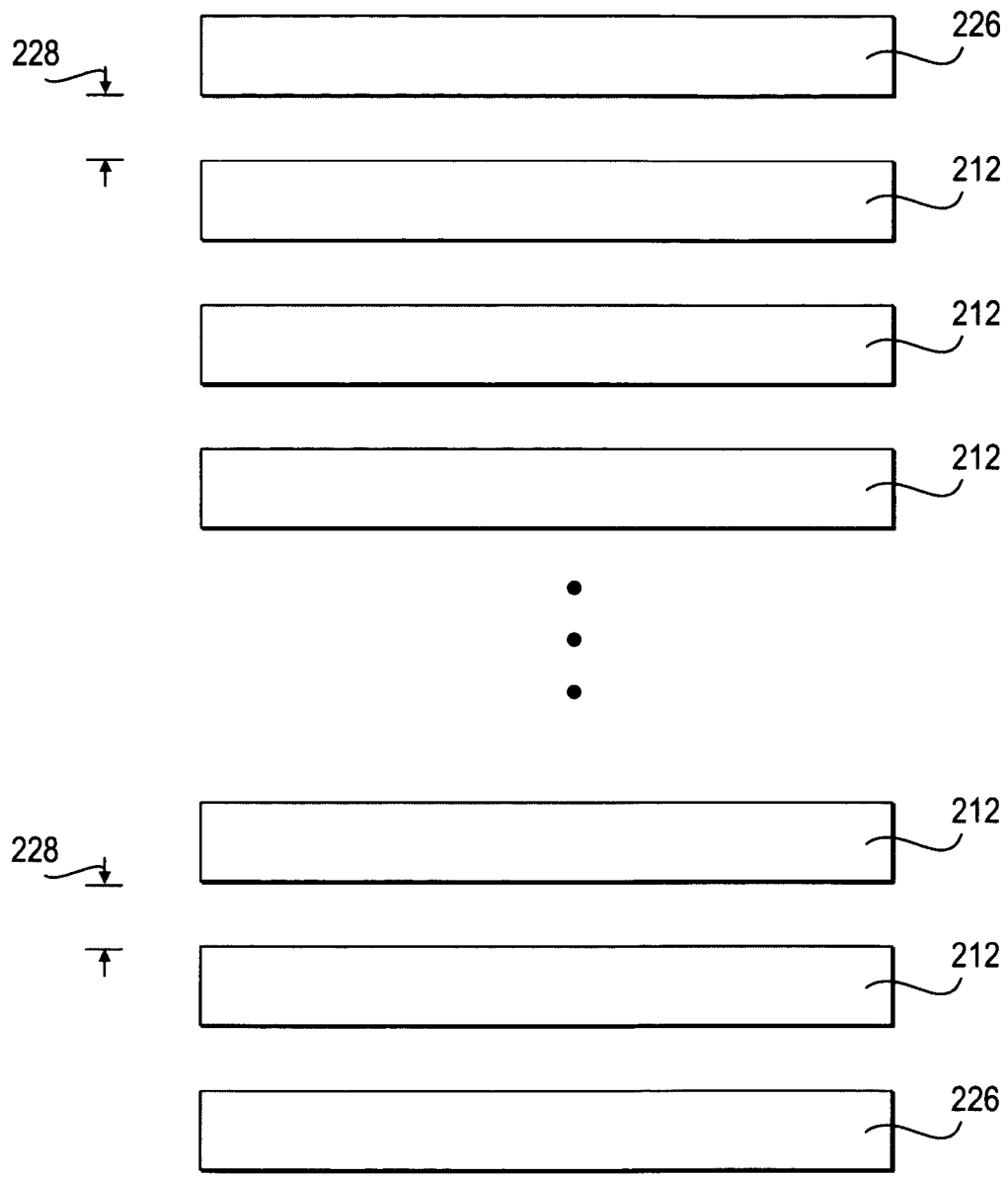
FIG. 4 illustrates an exemplary embodiment of a layout of a plurality of multiple conductive strips placed in parallel.

In one embodiment, the device 200 may have the top surface as that shown in FIGS. 3A-3B and the bottom surface similar to that shown in FIGS. 6A-6B where all the conductive strips 212 are arranged in parallel and the multilayered capacitors 204 are placed on the PCB 202 and interconnected to the conductive strips 212. In the present embodiment, the output pads 230 can be placed on the bottom side of the device 200 or the bottom side of the PCB 202 which is not visible in this figure. As previously discussed, a device such as the flexible circuit 240 can be configured with contact pads 242 can transmit signals from the conductive strips 212 to an external device. In the present embodiment, the flexible circuit 240 is brought into contact with the output pads 230 placed on the bottom side of the device 200 or the PCB 202 so that the contact pads 242 can be coupled to the output pads 230 as previously discussed. It is to be noted that the output pads can also be placed on the top surface of the device PCB 202 in a designated area and as such, the flexible circuit 240 needs not be placed on the bottom side of the PCB 202 but instead would be placed over the designated area for the interconnection.

In one embodiment, the device 200 is configured to be placed in a vacuum environment 246 (FIGS. 6A-6B). This is particularly useful when the device 200 is incorporated into a detector of a high-resolution electron spectroscopy instrument where it is common that the instrument be placed under vacuum. In the present embodiment, other devices that are configured to amplify and/or analyze the signals that come from the device 200 need not be placed under the vacuum environment 246. The flexible circuit 240 is able to withstand both the vacuum environment 246 and a non-vacuum environment 248. In one embodiment, the flexible circuit 240 is made of a polyimide material having a plurality of active (conductive) layers (not shown) insulated by a plurality of dielectric layers (not shown) that can transmit signals transferred to and from the contact pads 242 on the flexible circuit 240. The flexible circuit 240 can be made using methods known in the art. The flexible circuit 240 thus can transmit signals from the device 200 that is placed in the vacuum environment 246 to an external device (e.g., the analyzer 244) that is placed in the non-vacuum environment 248. In one embodiment, the flexible circuit 240 includes a plurality of output pins 254. The output pins 254 are interconnected to the plurality of contact pads 242 through a set of active layers such that the output pins 254 can transmit the signals that enter the flexible circuit 240 to the external device. The external device is also configured to include input members 256 that are complimentary to the output pins 254 in order to receive the signal from the flexible circuit 240.

In one embodiment, the flexible circuit 240 is inserted through a wall 250 that separates the two different environments. The wall 250 can be the instrument wall in one embodiment. For instance, the device 200 is placed inside a vacuum chamber with the wall 250. The flexible circuit 240 is inserted portionally into the vacuum chamber through an opening in the wall 250. An opening is created into the wall so that the flexible circuit 240 can be inserted therethough. The flexible circuit 240 has a portion that resides outside of the vacuum chamber. In one embodiment, a vacuum compatible seal 252 is used to seal the wall 250 to protect the vacuum environment 246 or the vacuum chamber. The flexible circuit 240 allows signals to be transmitted from the vacuum environment 246 to the non-vacuum environment 248 without the need for individual vacuum feed components that are currently used in the field. In one embodiment, the flexible circuit 240 is also configured so that the flexible circuit 240 can supply the necessary voltage or the high voltage to the device 200 (for example, through the input 262 provided on the PCB 202, FIG. 2). The flexible circuit 240 is configured to deliver the voltage to the input 262. As mentioned above, the high voltage is needed to supply to the conductive strips in order to attract the charged particles. A contact pad, which could be one of the contact pads 242 on the flexible circuit 240, can be provided for the high voltage to be applied to the device 200 through the flexible circuit 240. Additionally, the flexible circuit 240 may be configured to deliver the voltage to the voltage plane 260 through the input pad 264 (FIG. 2). Another contact pad such as contact pad 242 on the flexible circuit 240 can be designated to deliver the voltage to the voltage plane 260.

In another embodiment, instead of using one flexible circuit 240, two (or more) flexible circuits is configured similar to the flexible circuit 240 can be used. In the present embodiment, the plurality of contact pads 242 can be divided so that half of the contact pads 242 are on one flexible circuit and half of the contact pads 242 are on the other flexible circuit. Those two flexible circuits can be fed through the vacuum chamber using one opening or two openings depending on the particular need.

Figure 7A:
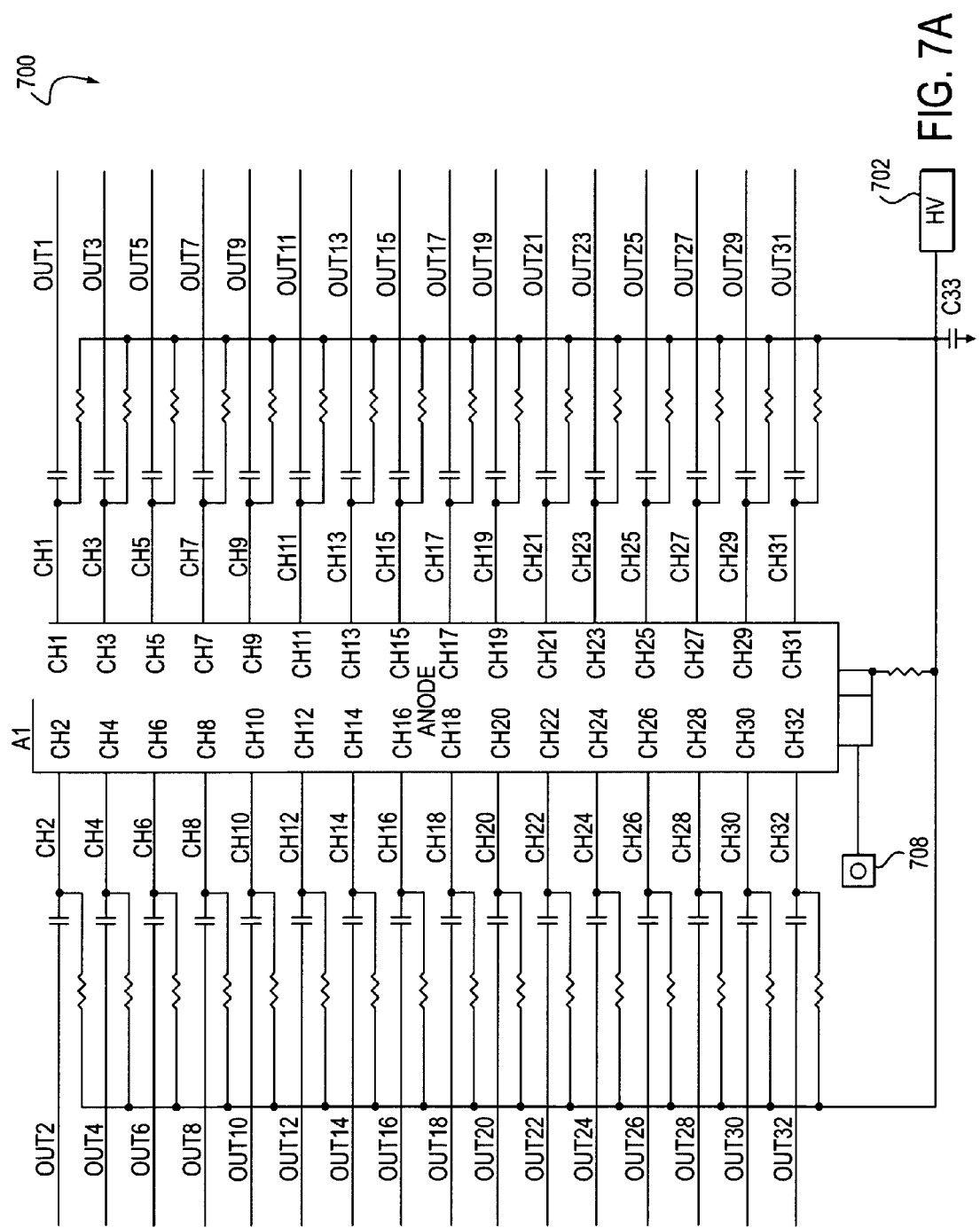
FIGS. 7A-7B illustrate an exemplary schematic diagram of an exemplary device of the present invention.
Figure 7B:
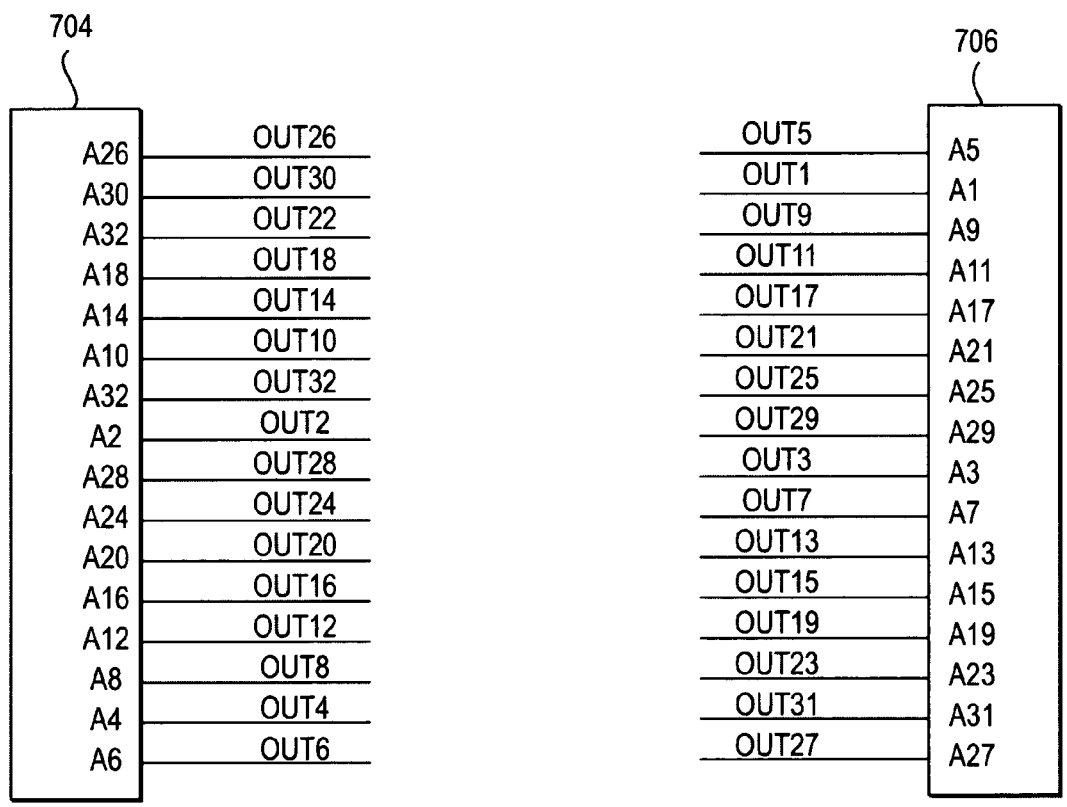

FIGS. 7A-7B illustrate an exemplary embodiment of a schematic diagram 700 used to deliver high voltage and/or other voltage necessary and/or signals to the device 200 and to transmit signals within and/or from the device 200. In an embodiment illustrated by FIGS. 7A-7B, a high voltage input 702 is provided. In one embodiment, the input pad, such as the input pad 262 (FIG. 2) is provided on the device 200 to allow the high voltage to be delivered to the device 200. In one embodiment, the high voltage input 702 is connected to the flexible circuit 240 (FIGS. 7A-7B) that is configured to deliver the high voltage to the device 200. A capacitor C33 is provided and interconnected to the input 702. The capacitor C33 may be a multilayered capacitor formed in the PCB 202 similar to the capacitor 204 previously described. The capacitor C33 filters out noises that may come into the device 200 with the high voltage. Other embedded capacitors may also be used to filter out the noises that may come into the device 200. The input 702 is also interconnected a plurality of multilayered capacitors, capacitors C1-C32. Each one of the capacitors C1-C32 is one of the capacitors 204 previously described. Each one of the capacitors C1-C32 also has a capacitance of about 200-300 pF and about 250 pF, in one embodiment. As illustrated in FIGS. 7A-7B, each of the capacitors C1-C32 includes two electrodes, electrode 1 and electrode 2, which represent electrode 204(1) and 204(2) as shown in FIG. 2. The plurality of capacitance plates 206 for each capacitor is not shown here for clarity purpose. In the embodiment where the device 200 is incorporated into a multichannel detector, each of the capacitors C1-C32 represents a channel, channels CH1-CH32 of the detector. For example, each of the capacitors C1-C32 is formed in the PCB 202 as previously described for the capacitor 204. Each of the capacitors C1-C32 is interconnected to a conductive strip, such as the conductive strip 212, or to a detector strip. Each of the capacitors C1-C32 is further coupled to a resistor (resistor R1-R32) formed (or printed) on the PCB 202 of the device 200 or discrete surface mounted resistors soldered or formed onto the device 200. FIGS. 7A-7B also illustrate that each capacitor is interconnected to a location on an anode A1. The anode A1 may comprise all of the individual conductive strips 212 (as shown in FIGS. 2 and 3B-3B) that are connected to the capacitors as previously discussed. In FIGS. 7A-7B, the conductive strips 212 may be indicated by notations CH1-CH32. The anode A1 may have the configuration of the top surface of the device 200 shown in FIGS. 3A-3B.

The input 702 can also supply voltage to other active layers or electrodes in the device 200. There may also be input (not shown) that are provided to supply a ground voltage to the various ground planes in the device and the ground plated sidewalls (previously described) in the device 200.

In one embodiment, the device 200 is configured to attract electrons and transmit signals generated by the electrons to an external device for analysis. In the embodiment, the high voltage supplied to the device is a positive voltage that can create a high positive bias on the conductive strips located on the anode A1. The electrons are attracted to the conductive strips provided on the anode A1 due to the high positive bias. The energies from the electrons generate signals that are transmitted by the capacitors C1-C32 to outputs OUT1-OUT32. Each of the outputs OUT1-OUT32 is essentially the output pad 230 previously described (FIGS. 6A-6B). Each outputs OUT1-OUT32 is then connected to a corresponding contacts A1-A32 on a flexible circuit 704 or a flexible circuit 706 that can transmit the signals to an outside device as previously discussed. The outputs OUT1-OUT32 may be connected to the contacts A1-A32 that are all provided on one flexible circuit similar to previously discussed (FIG. 6A). Alternatively, the contacts A1-A32 may be divided and provided on two flexible circuits 704 and 706 as shown in FIG. 7. The flexible circuits 704 and 706 are similar to the flexible circuit 240 previously described and include output pins that can transmit the signals to an external device such as an analyzer or an amplifier.

In one embodiment, the schematic diagram 700 includes an input 708 that can supply a voltage to a voltage plane 260 created in the device 200 as previously discussed (shown in FIG. 2 and not visible in FIGS. 7A-7B). In one embodiment, the voltage plane is biased with a negative voltage such that electrons will tend to deflect to the positively charged conductive strips located on the anode A1.

There are many methods that can be used to fabricate the device 200. A method that is typically used to manufacture a multilayered PCB can be used to build the device 200. In a typical method, various active layers are formed on the PCB 202 in a stacked up format. Processes such as chemical vapor deposition or physical vapor deposition can be used to form the active layers. A dielectric layer is formed between each two active layers. Vias are drilled through the layers, e.g., using laser drill or etch methods and the vias filled with conductive materials, to establish necessary interconnections.

An embodiment of the present invention pertains to an instrument 10 that can be used to analyze a specimen 40 and more particularly, the specimen surface 14 (FIG. 8). The instrument 10 includes a detector 70 that can incorporate the device 200 previously described. In one embodiment, the instrument 10 is high resolution electron spectroscopy. Such a high resolution electron spectroscopy can be found in U.S. Pat. No. 5,444,242 and U.S. Pat. No. 5,315,113 which are both incorporated herein by reference in their entireties. All parts of the instrument 10 of the present embodiment can be similar to those described in the U.S. Pat. No. 5,444,242 and U.S. Pat. No. 5,315,113 with the addition of the detector 70 that incorporates the device 200 previously described. The detector 70 is thus a multichannel detector that uses the device 200 as opposed to a conventional multichannel detector. In the embodiments of the present invention, the instrument 10 is placed under a vacuum environment or a vacuum chamber 11. External devices such as an analyzer, amplifier, processor, and/or monitor are placed outside of the vacuum chamber 11.

The instrument 10 comprises an electron gun 18, an anode 24, a deflection plate 28, and a focuser 34 that can cause energies generated by the electrons from the specimen to be detected by the detector 70. The electron gun 16 produces a focused electron beam 20 on an anode surface 22 of the anode 24. The anode 24 is disposed so as to receive the focused electron beam 20 and generate x-rays 27. The deflection plate 28 selectively directs the focused electron beam 20 to the anode surface 22. The focuser 34 is receptive of the x-rays 27 from the anode 24 and able to focus a predetermined energy band of the x-rays 27 as an x-ray spot on a selected area of a specimen surface 14 of the specimen 40. In one embodiment, photoelectrons 52 are emitted from the selected area of the specimen surface 24 and traveled to the detector 70 for analysis. The detector 70 receives the photoelectrons 52 from the selected area as previously described (as the photoelectrons hits the conductive strips 212 of the device 200 and transmitted to an external device such as an amplifier or an analyzer). The detector 70 thus produces signals representative of the photoelectrons 52. The detector 70 further comprises a PCB 202, one or more multilayered capacitors 204 each having a plurality of capacitance plates 206 and a plurality of dielectric layers 208 with each dielectric layer 208 being disposed between two capacitance plates 206, and one or more conductive strips 212 disposed on the top surface of the PCB 202 as previously described. As previously mentioned, each conductive strip 212 is interconnected to a multilayered capacitor 204.

In one embodiment, the electron gun 16 is configured with an appropriate electron lens system 18 for focusing the electron beam 20 onto the surface 22 of the target anode 24. The gun 16 may be a conventional type, modified to optimize for higher power and larger beam size. The gun 16 may also be an electron gun described in U.S. Pat. No. 5,444,242 and U.S. Pat. No. 5,315,113.

In one embodiment, the target anode 24 is formed of any metal such as aluminum that provides a desired x-ray emission energy band; ordinarily the band is substantially a line of small energy width. Preferably the target anode 24 is at or near ground potential, and the gun cathode is operated at a negative voltage, for example −20 KV, with respect to the anode to effect generation of x-rays including the desired band of x-rays of predetermined energy. The selected energy band is the aluminum K-alpha line at 1.4866 KeV.

The deflection plates 28 (one pair shown in FIG. 8) selectively direct or aim the electron beam 20 from the electron gun 16 to the anode on selective spots on the anode surface 22. In one embodiment, voltages from a deflection plate control 30, controlled by a processor 76 via a line 80, are applied to the deflector plates 28, which are arranged in both x and y axes, to establish the amount of deflection of the beam. This allow for the gun 16 to select particular spots on the anode surface 22. In an alternative aspect, the control 30 provides rastering of the focused electron beam 20 across the flat surface 22 of the anode 24, e.g., over an array of anode spots across the anode surface 22, and the x-rays 27 are emitted sequentially from successive anode spots. Typical raster speed is 100 Hz in the dispersive direction and 10 KHz in the non-dispersive direction.

In one embodiment, the focuser 34 is a Bragg crystal monochromator, advantageously single-crystal quartz. The focuser is disposed to receive a portion of the x-rays 27 from the anode 24. In one embodiment, the focuser 34 has a crystallographic orientation and a concave configuration 35 to select and focus a beam of x-rays 36 in the desired energy band, e.g. the K-alpha line, as an x-ray spot on the specimen surface 12 to be analyzed. As shown in FIG. 8, the specimen 14 rests on a stage 40 provide in the instrument 10.

The focuser 34 can be other focusing devices such as grazing incidence mirrors, Fresnel zone plates and synthetic multilayer devices of alternating high and low density material (e.g. tungsten and carbon). In each case, the focuser 34 includes a reflector that is curved to focus the diffracted x-rays onto the specimen in the manner disclosed.

The x-rays 36 cause photoelectrons 52 to be emitted from the selected area of the specimen 14. The electron energies generally include a low energy peak in the range of up to 10 ev, usually about 2 to 5 ev, plus higher kinetic energy peaks or lines characteristic of chemical species (viz. chemical elements and/or their electron bondings) in the selected pixel area. In the case of rastering, the characteristic photoelectrons vary with any varying chemistry across the array of pixel areas of the specimen, and the low energy electrons (commonly known as "secondary electrons") vary with topography as well. Detection or analysis of the photoelectrons is used to provide information on the surface at a selected area or across the rastered array of areas of the specimen 14.

There also may be Auger electrons which, for the present purpose, are included in the term "photoelectrons" as they are caused by the x-rays. There may be a second detector 88 included in the instrument 10 for the purpose of detecting and analyzing the Auger electrons. The detector 88 may incorporates the device 200 previously described.

In one embodiment, the photoelectrons 52 travel through paths 64 to reach the detector 70 which incorporates the device 200 previously described. The photoelectrons 52 are then detected and analyzed as previously described. The photoelectrons 52 may also be amplified prior to analyzed. The signals produced by the photoelectrons 52 are transmitted to an analyzer 72 connected to the detector 70. The signals produced by the photoelectrons 52 can also be transmitted to an amplifier (not shown) first prior to be transmitted to the analyzer 72. The analyzer 72 can be a conventional analyzer that can process a signals transmitted thereto. The analyzer 72 may include an amplifier (not shown) so that the signals produced by the photoelectrons 52 can be easily processed. The analyzer 52 may relay the signals produced by the photoelectrons 52 to the processor 76 which is configured to process the signal and relay the information to a display monitor as is known in the art. The processor 76 may provide an image representative of the signals and cause the image to be displayed on the monitor. The Auger electrons can also be detected by the second detector 88 and transmitted to the processor 76 in the similar manner as the detector 70.

Figure 9:
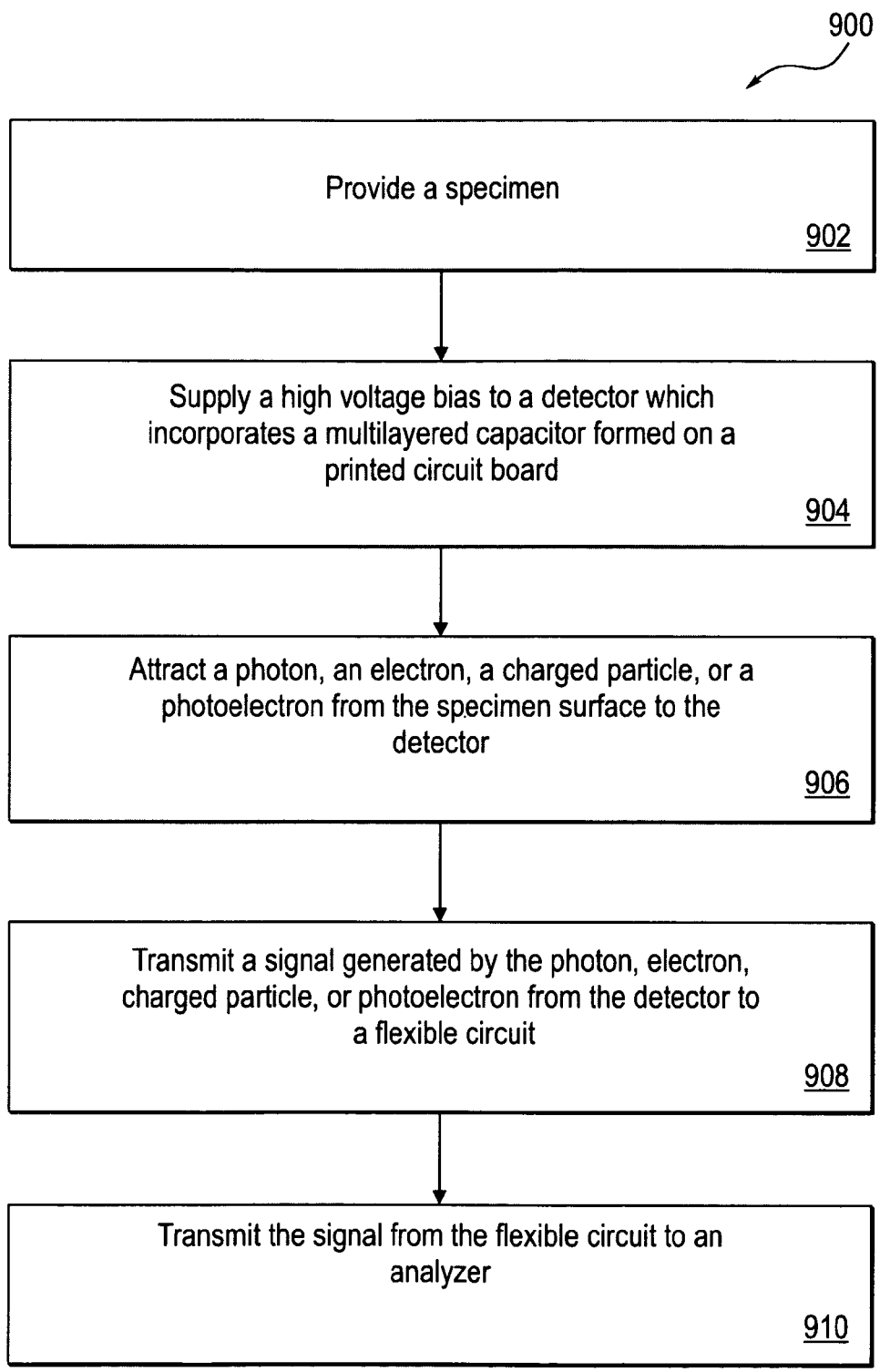
FIG. 9 illustrates an exemplary method of analyzing a specimen surface.

An embodiment of the present invention pertains to a method 900 (FIG. 9) of analyzing a specimen surface. At box 902, a specimen to be analyzed is provided. At box 904, a high voltage bias is supplied to a detector, which incorporates a multilayered capacitor formed on a PCB as previously described. At box 906, any one of a photon, an electron, a charged particle, and a photoelectron is attracted from the specimen surface to the detector. At box 908, a signal generated by any one of the photon, electron, charged particle, and photoelectron contacting detector is transmitted to a flexible circuit connected to the detector and configured to receive the signal. At box 910, the signal from the flexible circuit is transmitted to an analyzer. The detector includes a PCB having a multilayered capacitor formed thereon and a detector strip disposed on a top surface of the PCB wherein the multilayered capacitor is interconnected to the detector strip. The detector strip is biased with the high voltage. The multilayered capacitor allows the high voltage to be delivered to the detector strip. In one embodiment, the multilayered capacitor allows the high voltage to be delivered to the detector strips by blocking the high voltage from reaching a low voltage amplifier circuit. The multilayered capacitor includes a plurality of capacitance plates and a plurality of dielectric layers with each dielectric layer disposed between two capacitance plates. The detector strip attracts the photon, electron, charged particle, or photoelectron. The detector resides in a vacuum environment. The flexible circuit is configured to bring the signal from the vacuum environment to a non-vacuum environment. The analyzer may include an amplifier as previously discussed.

The detector may also be a multichannel detector incorporating the device 200 as previously discussed. The detector thus comprises a PCB having a plurality of multilayered capacitors formed thereon and a plurality of detector strips disposed a top surface of said PCB. The detector strips are biased with the high voltage. The multilayered capacitor allows the high voltage to be delivered to the detector strip. Each of the multilayered capacitors is interconnected to one of the detector strips. Each of the multilayered capacitors includes a plurality of capacitance plates and a plurality of dielectric layers. Each dielectric layer is disposed between two capacitance plates. The flexible circuit is configured to bring the signals from the vacuum environment to a non-vacuum environment.

On advantage of using a PCB with the multilayered capacitors in a detector includes increase reliability. The PCB with the build-in capacitors and resistors is much more reliable in the field than the assembly with many mechanical parts as a conventional detector. For example, when discrete capacitors are used in a conventional detector, the spring loaded capacitors and their parts may become intermittent over time. Another advantage is that with the detector fabricated onto a single PCB, a flexible circuit can be used to bring all of the signals out of the vacuum environment instead of needing individual connections to bring the signals out from each channel of the detector. Also, with the PCB and the flexible circuit, the signals may be improved because the PCB may be fabricated in a tightly controlled impedance and signal integrity environment of a PCB rather than an assembly of discrete capacitors and springs.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

I claim:

1. An electronic device comprising:
   a printed circuit board;
   a plurality of multilayered capacitors, each multilayered capacitor having a plurality of capacitance plates and a plurality of dielectric layers, each dielectric layer disposed between each two of said capacitance plates, the plurality of multilayered capacitors formed on said printed circuit board;
   a plurality of conductive strips disposed on a top surface of said printed circuit board, at least one of the conductive strips interconnected to at least one of the multilayered capacitors;
   a plurality of voltage planes disposed on said printed circuit board, at least one of the voltage planes disposed below said at least one conductive strip;
   a plurality of output pads, each of said plurality of output pads interconnected to each of said plurality of multilayered capacitors, and each of said plurality of output pads configured to transmit an output signal from each of said plurality of conductive strips, wherein said output signal is produced by any one of a charged particle, a photon, an electron, and a photoelectron that is attracted to each of said plurality of conductive strips; and
   a flexible circuit connected to said printed circuit board, said flexible circuit further comprising a plurality of contact pads, each of said plurality of contact pads connectable to one of said plurality of output pads, wherein said flexible circuit is capable of residing in both a vacuum and a non-vacuum environment, wherein said flexible circuit connects to said printed circuit board which resides in a vacuum environment, and wherein said flexible circuit is capable of delivering high voltage to said printed circuit board or to said plurality of multilayered capacitors.

2. The electronic device of claim 1 further comprising:
   ground plated sidewalls disposed about said printed circuit board, each of said ground plated sidewalls extending from said top surface to a bottom surface of said printed circuit board.

3. The electronic device of claim 1 wherein said capacitance plates are sandwiched between two or more ground plates provided in said printed circuit board.

4. The electronic device of claim 1 further comprising:
   a resistor formed on said printed circuit board, said resistor interconnected to at least one of the multilayered capacitors.

5. The electronic device of claim 1 wherein at least one of the conductive strips is configured to attract any one of a charged particle, a photon, an electron, and a photoelectron.

6. The electronic device of claim 1 wherein said printed circuit board is a detector.

7. The electronic device of claim 1, wherein each conductive strip of the plurality of conductive strips is separated from another conductive strip by about less than 15 mils.

8. The electronic device of claim 1 wherein at least one of the multilayered capacitors has a capacitance of about 200-400 pF.

9. The electronic device of claim 1 wherein at least one of the multilayered capacitors is capable of allowing a high voltage of about 2000-3000 volts or more to reach at least one of the conductive strips.

10. The electronic device of claim 1 wherein said capacitance plates are encapsulated between a top ground plate and a bottom ground plate formed on said printed circuit board and wherein a dielectric layer is disposed between each of said top ground plate and a top capacitance plate of at least one of the multilayered capacitors and between each of a bottom ground plate and a bottom capacitance plate of said at least one multilayered capacitor.

11. The electronic device of claim 1 further comprising:
    a top ground plate and a bottom ground plate formed on said printed circuit board, said top ground plate and bottom ground plate encapsulating said capacitance plates;
    a high K dielectric layer disposed between said top ground plate and at least one of the conductive strips; and
    a low K dielectric layer disposed between said top ground plate and at least one of the multilayered capacitors.

12. The electronic device of claim 1 wherein at least one of the voltage planes is insulated from at least one of the conductive strips by a dielectric layer.

13. The electronic device of claim 1 wherein at least one of the voltage planes is configured to have a negative bias.

14. The electronic device of claim 1 wherein at least one of the voltage planes is configured to have a positive bias.

15. The electronic device of claim 1, wherein at least one of the voltage planes is provided to control the movement of any one of a charged particle, a photon, an electron, and a photoelectron that moves toward at least one of the conductive strips, and wherein said at least one voltage plane is configured to deflect the any one of said charged particle, said photon, said electron, and said photoelectron to a top surface of said at least one conductive strip.

* * * * *